US012667917B2

(12) United States Patent
Leichsenring et al.

(10) Patent No.: US 12,667,917 B2
(45) Date of Patent: Jun. 30, 2026

(54) METHOD AND SYSTEM OF PRODUCING MICROSTRUCTURED COMPONENTS

(71) Applicant: 3D-Micromac AG, Chemnitz (DE)

(72) Inventors: Torsten Leichsenring, Wildenfels (DE); Kai Mittwoch, Striegistal OT Marbach (DE); Claudia Unger, Chemnitz (DE); Steffen Lötzsch, Hohenstein-Ernstthal (DE)

(73) Assignee: 3D-Micromac AG, Chemnitz (DE)

( * ) Notice: Subject to any disclaimer, the term of this patent is extended or adjusted under 35 U.S.C. 154(b) by 370 days.

(21) Appl. No.: 18/288,198

(22) PCT Filed: Apr. 26, 2022

(86) PCT No.: PCT/EP2022/061015
§ 371 (c)(1),
(2) Date: Oct. 25, 2023

(87) PCT Pub. No.: WO2022/229164
PCT Pub. Date: Nov. 3, 2022

(65) Prior Publication Data
US 2024/0367267 A1 Nov. 7, 2024

(30) Foreign Application Priority Data

Apr. 29, 2021 (DE) .......................... 102021204313.5

(51) Int. Cl.
*B23K 26/57* (2014.01)
*B23K 26/03* (2006.01)
(Continued)

(52) U.S. Cl.
CPC ............ *B23K 26/57* (2015.10); *B23K 26/032* (2013.01); *B23K 26/043* (2013.01);
(Continued)

(58) Field of Classification Search
CPC .... B23K 26/57; B23K 26/032; B23K 26/066; B23K 26/705; B23K 26/04; B23K 26/43;
(Continued)

(56) References Cited

U.S. PATENT DOCUMENTS

2005/0045090 A1 3/2005 Ikegami et al.
2009/0007933 A1 1/2009 Thomas et al.
(Continued)

FOREIGN PATENT DOCUMENTS

CN 109475974 A 3/2019
DE 10 2015 113 919 A1 2/2016
(Continued)

OTHER PUBLICATIONS

International Search Report dated Nov. 17, 2020 in counterpart International Application No. PCT/EP2022/061015 w/English translation.
(Continued)

*Primary Examiner* — James D Sells
(74) *Attorney, Agent, or Firm* — DLA Piper LLP (US)

(57) ABSTRACT

A method of producing a microstructured component includes a multiplicity of micro-functional elements on a substrate that carries an array of pixel-forming micro-light-emitting diodes on an electrical supply structure, including laser processing in at least one method stage in a laser processing station under control of a control unit, the method stage including positioning a workpiece to be processed in a processing position of the laser processing station by a workpiece movement system in reaction to movement signals of the control unit, the method including: observing the workpiece in a camera-based manner by a camera system, the observing including capturing at least one portion of the workpiece lying in the object field of a camera and also generating an image representing the portion; evaluating the
(Continued)

image by image processing to ascertain position data representing an actual position of at least one structural element of the workpiece in the object field.

24 Claims, 8 Drawing Sheets

(51) Int. Cl.

| | |
|---|---|
| *B23K 26/042* | (2014.01) |
| *B23K 26/064* | (2014.01) |
| *B23K 26/066* | (2014.01) |
| *B23K 26/067* | (2006.01) |
| *B23K 26/08* | (2014.01) |
| *B23K 26/402* | (2014.01) |
| *B23K 26/70* | (2014.01) |
| *H10H 20/01* | (2025.01) |
| *H10P 74/00* | (2026.01) |
| *B23K 101/40* | (2006.01) |

(52) U.S. Cl.
CPC ........ *B23K 26/0648* (2013.01); *B23K 26/066* (2015.10); *B23K 26/0676* (2013.01); *B23K 26/083* (2013.01); *B23K 26/402* (2013.01); *B23K 26/705* (2015.10); *H10H 20/018* (2025.01); *H10P 74/235* (2026.01); *B23K 2101/40* (2018.08)

(58) Field of Classification Search
CPC ............ B23K 26/0648; B23K 26/0676; B23K 26/083; B23K 26/0861; B23K 26/0884; B23K 26/38; B23K 26/402; H01L 22/24

USPC .......................................................... 156/64
See application file for complete search history.

(56) References Cited

U.S. PATENT DOCUMENTS

| | | | |
|---|---|---|---|
| 2009/0217517 | A1 | 9/2009 | Pique et al. |
| 2015/0179523 | A1 | 6/2015 | Sercel et al. |
| 2016/0052090 | A1 | 2/2016 | Tanigawa |
| 2020/0338919 | A1 | 10/2020 | Benayad-Cherif et al. |
| 2022/0118547 | A1* | 4/2022 | Ohkubo ............. B23K 26/0626 |

FOREIGN PATENT DOCUMENTS

| | | | |
|---|---|---|---|
| JP | 2006-315031 | A | 11/2006 |
| JP | 2013-123721 | A | 6/2013 |
| JP | 2018-176167 | A | 11/2018 |
| KR | 1020120050256 | A | 5/2012 |
| WO | 2007/063343 | A1 | 6/2007 |

OTHER PUBLICATIONS

Written Opinion dated Nov. 17, 2022 in counterpart International Application No. PCT/EP2022/061015.
Office Action dated Jun. 29, 2025, from counterpart Korean Patent Application No. 10-2023-7041101.
Office Action dated Dec. 31, 2026, from counterpart Taiwanese Application No. 111116326.

* cited by examiner

METHOD AND SYSTEM OF PRODUCING MICROSTRUCTURED COMPONENTS

TECHNICAL FIELD

This disclosure relates to a method and a system of producing a microstructured component comprising a multiplicity of micro-functional elements on a substrate, wherein laser processing is carried out in at least one method stage in a laser processing station under the control of a control unit, particularly to the production of a micro-LED display comprising a substrate that carries an array of pixel-forming micro-light-emitting diodes arranged on an electrical supply structure arranged on the substrate.

BACKGROUND

The term micro-LED (sometimes also called µLED) denotes a flat screen technology based on light-emitting diodes (LEDs). Micro-LED displays are microelectronic components based on arrangements (arrays) of microscopically small light-emitting diodes which form the picture elements of the display, also referred to as pixels. Between the individual µLEDs there are each interspaces, also referred to as streets. Individual pixels may consist of three subpixels, i.e., three µLEDs for red (R), green (G) and blue (B). This means that there may be streets between the µLEDs within a pixel as well. The micro-LEDs are self-luminous, dimmable and able to be switched off completely and therefore do not require a backlight as in liquid crystal displays (for short: LCDs).

In the course of the development of micro-LED technology as a new display technology, laser processing affords a number of possibilities, inter alia Laser Lift-Off (LLO) for separating the finished µLEDs from the sapphire growth substrate, Laser-Induced Forward Transfer (LIFT) for transferring the µLEDs from a donor to the substrate and/or laser repair, e.g., of µLED displays to rectify yield problems and defect rates.

Laser Lift-Off (LLO) is a method of selectively removing one material from another material. This utilizes a process in which the laser beam penetrates through a transparent base material and undergoes a high degree of coupling into a second material. LLO is often used in LED production to separate the GaN semiconductor from a sapphire base wafer.

Laser-induced forward transfer (LIFT) is a class of method in which material is transferred from a starting substrate (donor) to a target substrate (acceptor) by laser radiation.

An overview of the use of laser-based technologies in the fabrication of micro-LEDs may be found in the white paper "MicroLEDs—Laser Processes for Display Production" via the home page of the company Coherent available through Coherent Shared Services B.V., Dieselstraße 5b, D-64807 Dieburg.

Various concepts exist for production. They are mainly dependent on the manufacturer and the specific method variant thereof and are implemented by varying adaptation of LLO and LIFT methods. Massively parallel processing has to be realized in any case to be able to transfer the large number of µLEDs economically. This is done using masks having a multiplicity of openings or apertures which split a conditioned laser beam into a corresponding multiplicity of partial beams. The mask openings emitting laser radiation are then imaged onto the processing plane of the laser processing unit.

In that instance, the arrangement of the µLEDs on the epitaxial wafer may differ from the arrangement on the display. By way of example, the lateral spacings may be different. It is possible, e.g., to transfer only every n-th µLED and thereby attain the desired spacing on the display substrate. There is the possibility of using µLEDs in three different colors, from three different epitaxial wafers. Alternatively, it is possible to use, e.g., blue µLEDs with different color conversion layers (e.g., quantum dots).

Some manufacturers define micro-LED screens as screens with light-emitting diodes which have a luminous width of less than 50 µm or a luminous area of less than 0.003 mm$^2$. The width (lateral extent) of a µLED can range, e.g., from more than 30 µm (<100 µm) down to approximately 1 µm to 3 µm. The webs between the µLEDs are often only approximately 6 µm to 1 µm wide. Deviations from these currently typical dimensions are possible, particularly in the direction of further miniaturization, e.g., to create screens having even higher resolution.

The costs of providing systems suitable for such processes rise almost exponentially with the requirements concerning the possibility of producing ever finer structures in stable processes.

Against this background, it could be helpful to provide a method and a system of producing microstructured components that allow economic fabrication of such components even as miniaturization of the structures to be produced increases.

SUMMARY

We provide a method of producing a microstructured component including a multiplicity of micro-functional elements on a substrate, in particular for producing a micro-LED display including a substrate that carries an array of pixel-forming micro-light-emitting diodes on an electrical supply structure, including laser processing in at least one method stage in a laser processing station under control of a control unit, the method stage including positioning a workpiece to be processed in a processing position of the laser processing station by a workpiece movement system in reaction to movement signals of the control unit, the method including observing the workpiece in a camera-based manner by a camera system, the observing including capturing at least one portion of the workpiece lying in the object field of a camera and also generating an image representing the portion; evaluating the image by image processing to ascertain position data representing an actual position of at least one structural element of the workpiece in the object field; comparing the actual position with a target position of the structural element and generating correction signals depending on a deviation of the actual position from the target position; correcting the processing position by controlling the workpiece movement system to match the actual position to the target position based on the correction signals; and radiating in at least one laser beam directed at the workpiece to locally laser process the workpiece at at least one processing location of the workpiece.

We also provide a system that produces a microstructured component including a multiplicity of micro-functional elements on a substrate that carries an array of pixel-forming micro-light-emitting diodes on an electrical supply structure, including a control unit; a laser processing station with a laser processing unit controllable by the control unit; a workpiece movement system that positions a workpiece to be processed in a processing position of the laser processing station in reaction to movement signals of the control unit;

a camera system with a camera that observes the workpiece, the camera system designed to capture at least one portion of the workpiece lying in the object field of the camera and generate an image representing the portion; and an evaluation unit that evaluates the image by image processing for the purpose of ascertaining position data representing the actual position of at least one structural element of the workpiece in the object field, and comparing the actual position with a target position of the structural element and generating correction signals depending on a deviation of the actual position from the target position, the control unit configured to correct the processing position by controlling the workpiece movement system to match the actual position to the target position on the basis of the correction signals, and cause the laser processing unit to radiate in at least one laser beam directed at the workpiece to locally laser process the workpiece at at least one processing location of the workpiece.

BRIEF DESCRIPTION OF THE DRAWINGS

Further advantages are evident from the description of examples which are explained below with reference to the figures.

DETAILED DESCRIPTION

Figures 1, 2:
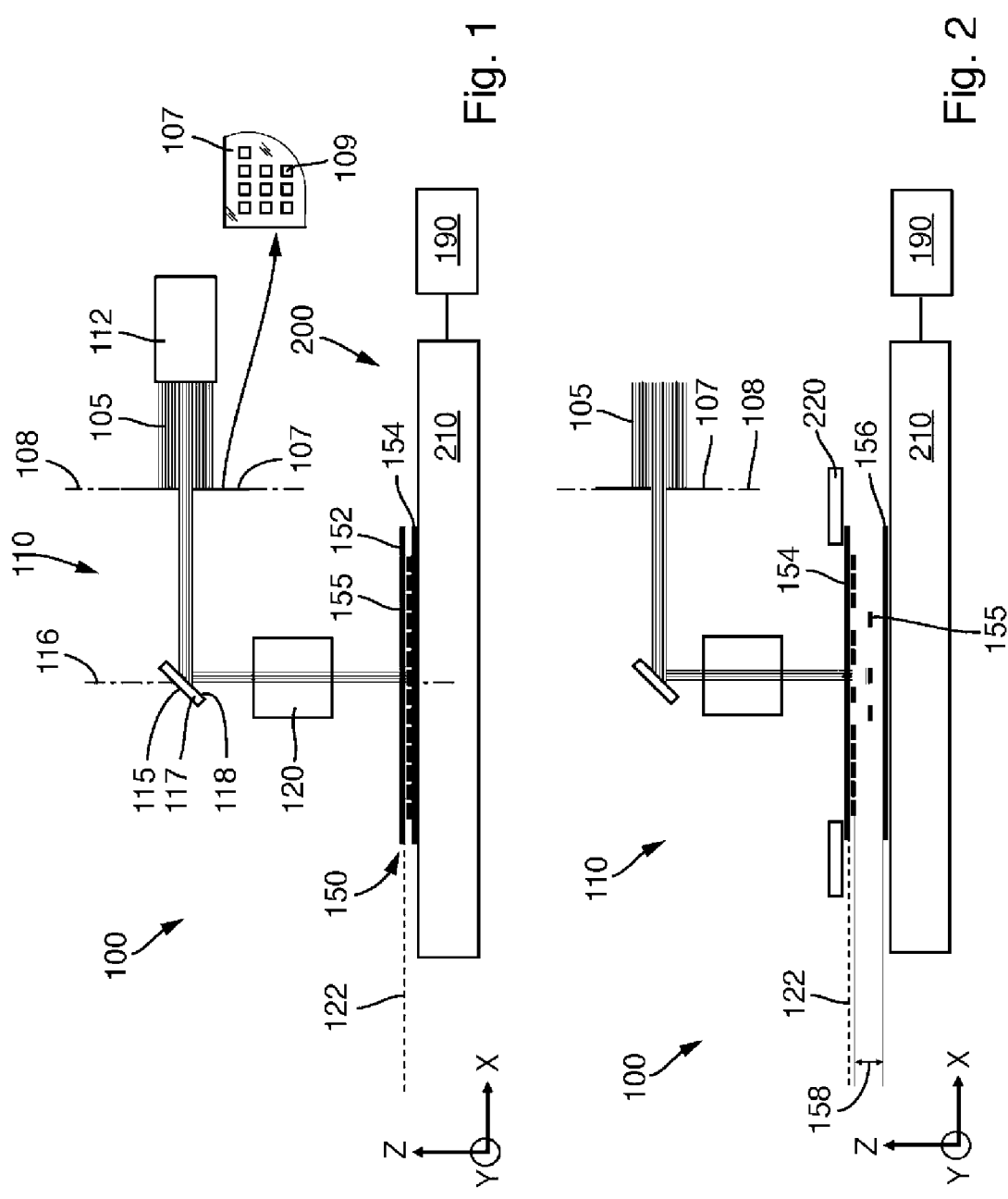
FIG. 1 shows a laser processing station configured for the method of laser lift-off (LLO).
FIG. 2 shows a laser processing station configured for laser-induced forward transfer (LIFT).

Our methods and systems produce microstructured components comprising a multiplicity of micro-functional elements on a substrate. These can be, e.g., microelectronic and/or micromechanical functional elements. One example is the production of a micro-LED display comprising a substrate (display substrate), which carries an array of pixel-forming micro-light-emitting diodes on an electrical supply structure (also backplane).

Laser processing is carried out in at least one method stage in a laser processing station under the control of a control unit. This involves radiating in laser radiation having predefinable beam properties in a predefinable manner onto the workpiece to bring about locally delimited changes on the workpiece. The laser processing may also be referred to as laser micro-processing since processing accuracies in the micrometer range (e.g., a few micrometers, possibly even less than one micrometer) may be required.

The workpiece can be a substrate that has not yet been processed, or a substrate carrying a coating and/or other functional structures.

In this method stage a positioning operation is carried out, inter alia. In the positioning operation, a workpiece to be processed is moved into a processing position of the laser processing station in reaction to movement signals of the control unit. The positioning movement is effected such that the workpiece is situated in a sought position at a predefined point in time. In this configuration, the workpiece can move continuously and pass through the sought position at a finite speed such that it is situated at the sought position at the target time ("dynamic positioning"). The positioning movement can also be controlled such that the movement is briefly stopped when the workpiece is situated in the target position ("static positioning").

To carry out this workpiece movement, the laser processing station comprises a workpiece movement system. A movement system is an electromechanical system for movement and positioning purposes in automation and allows an object moved thereby to be moved and positioned according to a specific movement profile in two or three dimensions. They are often also referred to as movement and positioning systems.

A camera-based observation of the workpiece takes place. The observation is carried out with the aid of a camera system comprising at least one camera, and comprises image capture, i.e., capturing at least one portion of the workpiece lying in the object field of the camera and also generating an image representing the portion. This can be a single image or a plurality of images.

In an evaluation operation, with the aid of an evaluation unit of the system, the image is evaluated by image processing to ascertain position data representing the actual position of at least one structural element of the workpiece in the object field at the time of image capture. The structural element is an element on the workpiece which is readily identifiable in the image with regard to its position. Suitable structural elements are, e.g., contact pads on the backplane, alignment marks applied specifically to specific locations, one or more LEDs or other functional elements.

In a comparison operation, the actual position is compared with a predefined target position of the structural element. On the basis of the comparison, correction signals are generated depending on a deviation of the actual position from the target position.

If the actual position of a selected structural element of the workpiece as established by camera-based observation and image evaluation does not correspond to the target position, or does not correspond thereto even allowing for a possibly acceptable small deviation, correction signals or correction values are generated that represent the extent of the deviation and indicate a need for correction. If the comparison reveals that the actual position established already corresponds to the target position sufficiently well, a corresponding correction signal ("no correction necessary") can be generated, which would correspond to a correction value of zero.

On the basis of the result of the comparison, in the context of a position correction by producing a correction movement a correction of the processing position of the workpiece is effected by controlling the workpiece movement system such that the actual position of the structural element is matched to the target position as well as possible. In this configuration, the target position need not be attained exactly, but the difference between target position and actual position must be reduced such that the actual position after the position correction lies within the tolerance range with respect to the target position.

Finally, at least one laser beam directed at the workpiece is radiated in onto the workpiece for the purpose of local laser processing of the workpiece at at least one processing location of the correctly positioned workpiece.

A system configured and suitable for carrying out the method accordingly comprises a control unit, the laser processing station with the laser processing unit controllable by the control unit, and also a workpiece movement system, which can move a workpiece in reaction to movement signals of the control unit. Furthermore, provision is made of a camera system with a camera for observing the workpiece and capturing one or more images, the latter then being evaluated in the evaluation unit. The evaluation unit is configured for evaluating the image by image processing for the purpose of ascertaining position data representing the actual position, and also carries out the comparison of the actual position with the target position of the structural element for the purpose of possibly generating correction signals in the event of excessively large deviations. Depending on the result of the evaluation, the control unit is caused to correct the processing position by controlling the workpiece movement system thereby to match the actual position to the target position on the basis of the correction signals. After the evaluation and the possible position correction, the actual position lies at or close to the target position with high accuracy. If this does not happen, the control unit can cause the laser processing unit to radiate in at least one laser beam directed at the workpiece for the purpose of the local laser processing of the workpiece at at least one processing location of the positioned workpiece.

We surprisingly found that even in high-quality and correspondingly expensive workpiece movement systems, the absolute accuracy of the positioning over relatively large travel distances and, if appropriate, over a relatively long period of time, as is required for display production for the process for accurately positioning very small micro-LEDs, is insufficient or scarcely sufficient. In travel distances of the order of magnitude of 500 mm, the absolute position error may indeed amount to several micrometers. In contrast, the non-correctable repetition error in a travel distance of less than 50 mm should be less than 100 nm and thus lie in the required accuracy range in a relatively short period of time after a correction.

Our workpiece movement system can be utilized for high-precision laser processings even if it generates relatively high absolute position errors in large travel distances, for example, since by way of the camera-based observation including image processing, ascertaining of possible position errors and position correction oriented thereto, the position of the workpiece required for the laser microprocessing can nevertheless be set with extremely high precision in the micrometer range even after relatively long travel distances. In this respect, a camera-based position regulation is implemented which can compensate for possible structural or fundamental weaknesses of commercial workpiece movement systems using relatively cost-effective means.

Massive parallel processing can be realized, for example, to be able to economically transfer a large number of μLEDs. A mask having a multiplicity of mask openings may be used to enable simultaneous parallel processing at a multiplicity of processing locations. The mask splits an optionally prepared laser beam into a multiplicity of partial beams. The mask openings emitting laser radiation are then imaged onto a processing plane of the laser processing unit. In the system, the mask is arranged in a mask plane optically conjugate to the processing plane. An optical imaging system is used to image the mask openings emitting laser radiation onto a processing plane of the laser processing unit. Preferably, a mask movement system is provided, the latter carrying the mask and, under the control of the control unit, allowing a displacement of the mask in the mask plane and a rotation of the mask about an axis perpendicular to the mask plane.

The workpiece may be moved continuously by the movement system and a laser pulse triggered at the predefined positions. This results in a laser pulse frequency within the scope of the specification of the laser system and a spacing of the processing positions and also a specific travel speed of the substrate. For the purpose of image recording for the correction, what is effected is a positioning with a momentary standstill or a positioning with a very slow movement through the desired position, which is present only over a short, but sufficient period of time.

One configuration involves working with sectors step by step. A sector is a partial region or a portion of the entire workpiece, which can be divided virtually into a multiplicity of identical or non-identical sectors. A sector can have, e.g., a rectangular shape with identical or non-identical side lengths. In this configuration, the method comprises generating and storing a grid of correction values within a measured sector and subsequently processing this sector. In this configuration, the corrected values are utilized for the laser processing of the workpiece. An interpolation of the intermediate values at the non-measured positions is optionally carried out.

Narrowband light may be used or utilized for the camera observation and image capture. It is thereby possible to make a further contribution to achieving extremely high positioning accuracies or extremely small positioning errors. The term "light" is used generally both for electromagnetic radiation from the spectral range visible to the naked eye and for electromagnetic radiation not visible to the naked eye, in particular from the ultraviolet spectral range UV. In this application, narrowband light is also referred to as "quasi-monochromatic" or "single-colored" light. The terms "narrowband," "quasi-monochromatic" or "single-colored" are synonyms and intended to clarify that the light is electromagnetic radiation from a relatively narrow wavelength range or from a narrow wavelength band. The spectral bandwidth of the narrowband light or of the narrowband radiation can be significantly less than 100 nm, preferably the spectral bandwidth of the light utilized for the image capture being able to be 50 nm or less, in particular 10 nm or less. There are various possibilities for implementing this.

For the camera observation and image capture at least during the capture of an image an illumination region (which encompasses the object field of the camera) on the workpiece may be illuminated with narrowband illumination light. For this purpose, the system can comprise an illumination system comprising an illumination light source that is already narrowband per se and/or optical devices (e.g., gratings or filters) to limit the illumination light spectrum of an illumination light source to a narrower wavelength range.

By way of example, suitable light-emitting diodes (LEDs) or laser diodes can be used as light source that generate the illumination light. In some configurations, the light of the laser of the laser processing unit can also be utilized at correspondingly lower intensity for illumination purposes. Owing to the use of quasi-monochromatic illumination light, the arising of chromatic aberrations can be avoided or reduced to an extent such that the resolution for position measurements is not appreciably impaired as a result. For beam guiding purposes, the use of single-colored illumination light makes it possible to use optical systems such as laser optical units, for example, which are generally not chromatically corrected.

Alternatively or additionally, between the object plane of the camera (or the processing plane of the laser processing unit) and the camera sensor it is possible to arrange a filter, a grating and/or some other wavelength-selective device which, e.g., with the effect of a bandpass filter only transmits light from a narrow wavelength band to the camera such that only narrowband or quasi-monochromatic light is utilized for the generation of the image utilized for the evaluation.

To achieve as homogeneous an intensity distribution as possible in the illuminated regions, the illumination system can be configured such that the principle of Köhler illumination is utilized. As an alternative, e.g., a ring light can be utilized as illumination light source.

In combination with the camera-based position regulation, a system is provided which makes it possible to ensure laser processing with extremely high positioning accuracy of the processing locations under economically reasonably representable conditions.

The productive laser processing of substrates often takes place "on-the-fly," i.e., during the movement of the substrate such that an available time window for the exposure and the creation of an image would only be relatively small unless a pulse laser is used as light source of the illumination system. In some situations a complete "on-the-fly" correction could occur too late to compensate for relatively large deviations. Therefore, in accordance with preferred configurations, we provide that the observation and image processing are realized within a correction operation before the laser processing and the laser processing step (e.g., for realizing an LLO, LIFT or repair process) is only started after the corrected processing position has been set. The laser processing thus starts as promptly as possible after a possible displacement of the workpiece for correcting a position error. Preferably, the workpiece does not move during the image capture such that the measurement for the correction is effected with the workpiece stationary.

The correction should be effected as locally as possible, i.e., where the next laser processing takes place, with the smallest possible travel distances. In other words, that region in which the structural elements used for the position measurement lie should lie as close as possible to the next processing location. For this purpose, the preferred processing employing sectors step by step has proved worthwhile since only travel distances of the order of magnitude of the sector transverse dimensions (e.g., from approximately 10 mm to approximately 30 mm) have to be covered.

Moreover, it is regarded as advantageous if the position correction is effected promptly before the beginning of the next processing step, i.e., in particular before an additional error possibly occurs on account of energy input during the processing. The additional error can be compensated for if a new measurement is carried out beforehand. The intervening times can be, e.g., of the order of magnitude of one second or less, e.g., down to one millisecond. The processing should thus be effected directly after the position correction, without further movements not associated with the processing, e.g., without an interposed beam analysis.

The laser processing unit comprises an imaging lens for imaging a mask plane into the processing plane of the laser processing unit, which usually lies in or in the vicinity of the surface of the workpiece. In preferred examples, it is provided that the camera-based observation of the workpiece to be positioned or of the positioned workpiece is effected by the camera through the imaging lens. In other words, an observation beam path passes from the workpiece or the workpiece-side object plane of the imaging lens through the imaging lens to the camera. The observation beam path, which guides illumination light onto the portion to be observed, preferably likewise passes through the imaging lens. This is readily possible particularly if single-colored illumination light is used, for the beam guiding of which optical units that are not chromatically corrected can also be utilized. A camera-based observation through the lens (TTL) enables particularly precise measurement results with compact overall dimensions of the components required for the measurement. In particular, with the use of TTL observation it is possible to avoid additional errors that could arise, e.g., as a result of travel with respect to a measuring camera arranged off-axis.

In some examples, the illumination region on the workpiece is illuminated with quasi-monochromatic illumination light with an illumination wavelength in the ultraviolet range (UV illumination light). For this purpose, the illumination system can comprise a light source that emits in the ultraviolet range. Compared to the use of visible light, the use of ultraviolet light for measurement affords the advantage, inter alia, of a higher resolution on account of the shorter wavelength. This means that by a camera it is possible to capture and evaluate even finer structures more precisely than with the use of longer wavelengths. In particular, it is possible to use illumination wavelengths of less than 300 nm, for example, illumination wavelengths of around approximately 270 nm or illumination wavelengths of around approximately 248 nm or less.

Although an observation in the UV range may be somewhat more expensive on account of the higher prices for UV-sensitive cameras, the finer structures sought can be produced more reliably as a result of the higher resolution.

A further advantage of the use of ultraviolet light for illumination arises in many examples by virtue of the fact that for the purpose of laser processing a laser wavelength in the ultraviolet range is likewise utilized, e.g., a wavelength at 193 nm, 248 nm, 308 nm or 355 nm. In particular, an excimer laser, for example, a KrF excimer laser having an emission wavelength of approximately 248 nm, can be utilized as laser source. Such excimer lasers have proved worthwhile for laser processing. Use of illumination light having similar wavelengths enables a good adaptation to the laser processing unit. If the illumination light has an illumination wavelength which corresponds to the laser wavelength or is in the vicinity thereof, then it is possible particularly easily, in transparent optical components, to design the antireflection coating thereof such that they have an antireflective or transmission-increasing effect both for the laser wavelength and for the illumination light.

It is also possible for the illumination system to be designed such that illumination light with an illumination wavelength in the visible spectral range (VIS) is utilized, preferably narrowband green light with a wavelength of 490 nm to 575 nm being used for illumination. It is thus possible to realize a good compromise between provision costs and achievable resolution since high-quality cameras sensitive to green light are also available at favorable costs and since, on the other hand, experiments have shown that sufficiently good spatial resolutions can be achieved in many configurations with illumination with narrowband green light.

To be able to realize different functionalities with overall a compact structural size of the system, in preferred examples, it is provided that the laser processing unit comprises a beam deflection device with a substrate and, arranged thereon, a beam deflection surface oriented obliquely with respect to a principal axis of the laser processing unit and serving for deflecting the laser beam in a propagation direction running substantially parallel to the principal axis. As a result, the laser radiation source and the beam guiding components disposed downstream can be constructed such that the radiation is incident substantially in a horizontal direction, while the principal axis of the laser processing unit is oriented vertically. The principal axis of the laser processing unit here denotes that axis which is defined by the optical axis of the imaging lens.

On the other hand, to enable an observation through the imaging lens of the laser processing unit, it is preferably provided that an observation beam path running between the processing plane of the laser processing unit and the camera leads through the beam deflection surface, the beam deflection device being designed such that it at least partly transmits illumination light. In other words, the beam deflection surface is intended to have a certain transmission for illumination light, i.e., not to completely reflect and/or absorb it.

The substrate of the beam deflection device can be coated with a dielectric coating that forms the beam deflection surface. The coating is preferably designed such that it has a very high reflectance (for example, of more than 99%) for the entering laser light in the course of the angles of incidence present and has a relatively high transmission, e.g., of 20% to 70%, for the illumination light used for the purposes of illumination.

The substrate of the beam deflection device may be a plane plate transparent to illumination light and tilted relative to the principal axis about a first tilt axis oriented perpendicular to the principal axis, e.g., by 45°. The substrate can consist, for example, of synthetic fused silica or some other material transparent to ultraviolet light and visible light with a low coefficient of thermal expansion.

The use of such a beam deflection device affords the possibility of separating the laser beam path and the observation beam path in the region of the beam deflection device. However, experiments have shown that depending on the design of the beam deflection device, it may be that as a result the optical paths in the observation beam path may be changed such that astigmatic aberrations that impair the resolution capability may occur. In preferred examples, an illumination light-transmitting astigmatism compensation unit is therefore arranged in the observation beam path between the beam deflection device and the camera. The astigmatism compensation unit is designed to at least partly compensate for the astigmatic aberration portions introduced, as a result of which the resolution capability of the observation system can be increased overall.

When the substrate of the beam deflection device is an illumination light-transmitting plane plate tilted relative to the principal axis about a first tilt axis oriented perpendicular to the principal axis, the astigmatism compensation unit preferably comprises a plane plate transparent to illumination light and tilted relative to the principal axis about a second tilt axis oriented perpendicular to the principal axis and to the first tilt axis. The plane plate of the beam deflection device and the astigmatism compensation unit should have the same or substantially the same thickness such that they introduce astigmatic distortions in two mutually perpendicular directions, which distortions mutually compensate for one another on account of the different orientation of the tilt axes. The observation system can thus be designed such that no astigmatic aberrations impairing the resolution of the sample observation remain between the object plane of the camera and the light-sensitive sensor (for example, CCD sensor or CMOS sensor).

An exact positioning of the workpiece and of the functional elements possibly applied thereon in space is an important contribution to achieving extremely high processing accuracies. Further contributions arise on the part of the laser processing unit since the position of the impinging laser beams in space should be known for a positionally accurate processing. Moreover, a homogeneous intensity distribution over the entire beam cross section and also a high edge steepness at the margin of the mask apertures are important prerequisites for a high processing quality.

During the laser processing, ideally each individual functional element, for example, each micro-LED should be individually irradiated, specifically completely and uniformly across the LED, while adjacent LEDs are not impinged on by the radiation provided for an LED, but rather only by the laser beams assigned to them.

For the metrological capture of suitable measurement variables, preferred examples comprise a camera-based beam analysis system integrated into the laser processing station and serving for in-situ analysis of beam parameters of the laser beam. This makes possible a beam diagnosis promptly with respect to the processing, for example, in the context of setting up the laser processing station, or monitoring of the beam quality while ensuring a correct imaging of the mask onto the workpiece.

Preferably, the beam analysis system comprises at least one beam analysis unit comprising a camera arrangement sensitive to the laser wavelength with a camera having an object field which lies in the processing plane of the laser processing unit or in a plane optically conjugate to the processing plane. What can be achieved with this arrangement is that the camera can capture an image of the laser beams effective in the processing plane, the image being as sharp as possible and allowing good resolution, or, e.g., an image of the illuminated apertures of the mask. Therefrom, in an evaluation device, beam parameters and alignment parameters can then be ascertained and processed to correct possible errors by the control unit.

In some examples, the camera arrangement has a camera sensitive to the laser wavelength, preferably a camera sensitive to ultraviolet light (UV camera), which can directly process the laser light of a UV laser. Alternatively, it is also possible to equip the camera arrangement with a camera sensitive to visible light and to provide a planar converter arranged in an object plane of the camera and configured for converting light of the laser wavelength into light from the visible spectral range. The converter thus emits visible light precisely with the spatial distribution present in the processing plane or in the mask plane.

In general, the object field of the camera is not large enough to simultaneously capture all apertures of a mask. Rather, only subgroups of the apertures are respectively captured. In this example, for the diagnosis of the complete mask structure, the camera is moved over the plane to be measured in the step-and-repeat method and, in the evaluation unit, individual images are combined by software to form an image of the complete mask and are evaluated by image processing. Alternatively, it is also possible for the individual images already to be evaluated.

So that a measurement of the position of the masks is possible at any time, it is possible to mount the beam analysis system at the positioning device of the acceptor substrate outside the substrate table or on a separate positioning unit. That fosters a precise positioning of the beam analysis system in the sub-μm range, which is a prerequisite for the exact combination of the individual images and thus the correct analysis of the laser beam in the processing plane.

The measurement of the positioning device can then be effected using a high-precision lithographic mask structure that is imaged into the processing position using the laser apparatus. At the positions where adjacent images are joined together, this reveals a deviation from the original structure that represents a measure of the relative positioning error in X- and Y-directions (in each the sum of the X- and Y-errors at the two positions where the images were recorded). After these deviations have been calculated, the error can then be compensated for.

A camera-based beam analysis system for in-situ analysis of beam parameters of the laser beam of the type described herein can also be independent of the other features. Consequently, a laser processing system with an integrated beam analysis system is also disclosed, but without camera-based position correction or without camera-based position regulation.

We recognized that it is possible, from the observation of processes proceeding in direct proximity to the processing location during the laser processing, to draw conclusions about process control possibilities and control process parameters on the basis thereof. In some examples, for these purposes, a camera-based shadowgraph analysis system for in-situ observation and analysis of rapidly proceeding processes in the region of the processing zone influenced by a laser beam is integrated into the laser processing station. It is thus possible, by "shadowgraphy" or by shadowgraph generation and analysis, e.g., to obtain knowledge of the processes proceeding during laser ablation and enable corrections of processing parameters in unfavorable processes. The shadowgraph analysis system is also referred to as "shadowgraphy system" hereinafter.

A shadowgraph analysis system or the technique of shadowgraphy can be utilized, for example, in the context of process development and process monitoring. Another field of application is in the area of repair processes, i.e., process steps which enable partially defective components such as, e.g., μLED displays, to be repaired to improve the yield overall.

The shadowgraph analysis system comprises a short-pulse light source or flash light source for the time-controlled incidence of short illumination light pulses or flashes in an incidence direction oriented transversely with respect to the laser beam. Furthermore, the system comprises on an opposite side a camera for capturing shadowgraphs of the processing zone irradiated by the laser beam. Furthermore, provision is made of an evaluation unit for evaluating camera images of the camera.

It is preferred to effect the incidence of illumination light pulses into the region of the processing zone parallel to the processing plane. Alternatively, incidence at a relatively shallow or acute angle is possible, which angle can be, e.g., less than 30° or less than 20°.

A particularly critical process stage, for example, during the production of a micro-LED display is the transfer of micro-LEDs with the aid of the LIFT method, which generally employs a very small donor-acceptor spacing. In-situ monitoring of the process would be desirable. Without such monitoring the parameter search and control and also fault finding in the event of quality problems prove to be difficult.

In some examples, a LIFT processing station (i.e., a laser processing station designed for a LIFT process) is provided, which allows high-resolution shadowgraphy on a relatively small area (measurement area). This means that in any case in the region of the small measurement area, for example, the flight phase of micro-LEDs after detachment from the donor can be accurately characterized.

We additionally succeeded in developing a configuration of a shadowgraph analysis system which enables shadowgraphy even if the processing zone observed lies within a region difficult to access laterally, for example, in the vicinity of the surface of a donor substrate during the fabrication of micro-LED displays. One example of a shadowgraph analysis system suitable for this is characterized by a beam deflection system, in particular a mirror system, with a deflection element, in particular a deflection mirror, arranged between the short-pulse light source and the processing zone and serving for deflecting illumination light from a direction oriented obliquely with respect to the processing plane into an incidence direction running parallel to the processing plane and with a deflection element, in particular deflection mirror, arranged between the processing zone and the camera and serving to deflect radiation passing parallel to the processing plane into an incidence direction of the camera oriented obliquely with respect to the processing plane. It is thus possible to obliquely arrange a high-performance camera at almost any x-y-position of the relatively large workpiece relatively close to the latter and to nevertheless attain in the region of the processing zone a shadowgraphy beam path running parallel to the processing plane. It is thereby possible for repair processes also to be monitored by shadowgraphy. For beam deflection purposes, e.g., a prism can also be utilized instead of a mirror.

It is particularly advantageous examples when the shadowgraph analysis system is configured to trigger a series of illumination pulses in a manner triggered by laser pulses of the laser processing laser such that the part detached from the workpiece is imaged in an image multiply, at different times at different positions, by the camera sensor integrating over the series of illumination pulses, and for evaluating the image. A multiple exposure is thus carried out. It is thereby possible to realize, e.g., trajectory tracking which involves ascertaining and analyzing the trajectory of a part, e.g., of a μLED, detached from the workpiece by a laser pulse. The process parameters can then be controlled such that the trajectory at the detachment location leads to the envisaged installation location at the acceptor with sufficient precision.

A camera-based shadowgraph analysis system for in-situ observation and analysis of rapidly proceeding processes in the region of the processing zone influenced by a laser beam of the type described in this application can also constitute a protectable invention independently of the other features. Consequently, a laser processing system with an integrated, camera-based shadowgraph analysis system is also disclosed, but without camera-based position correction or without camera-based position regulation.

Some examples of our methods and systems of producing microelectronic components using laser processing methods are presented below. The microelectronic components each comprise a multiplicity of micro-functional elements applied on a substrate. The field of application of primary importance in the examples is the production of a micro-LED display. Such a display comprises a substrate that carries an array of micro-light-emitting diodes (μLEDs) that are intended to form the individual picture elements or pixels of the display. The latter are applied on an electrical supply structure. Laser processing is carried out in at least one method stage in a laser processing station. The laser processing may also be referred to as laser micro-processing since it can be used to process and/or produce fine structures having typical structure sizes of the order of magnitude of one micrometer or a few micrometers.

FIGS. 1 and 2 schematically show some known components of a laser processing station 100. The laser processing station is configured for the method of laser lift-off (LLO) in FIG. 1, and for laser-induced forward transfer (LIFT) in FIG. 2.

The laser processing station 100 comprises a laser processing unit 110 that works with laser radiation of a laser radiation source 112 in the form of a KrF excimer laser, which emits a laser beam 105 with a laser wavelength of approximately 248 nm, i.e., laser radiation in the deep ultraviolet range (DUV). The laser beam is radiated in in a horizontal direction parallel to the x-axis of the system coordinate system.

The laser beam expanded and/or conditioned in some other way passes through a mask 107 arranged in a mask plane 108 and comprising a grid arrangement of apertures or openings 109, which each transmit partial beams such that a group of partial beams emerges, which enable parallel processing (simultaneous processings at a multiplicity of locations on the workpiece). The mask can have hundreds or thousands of mask openings 109 generally fashioned in an identical way (cf. detail). The mask openings can be of various shapes, e.g., square, inequilateral rectangular or the like.

The rays in the partial beams are deflected at a beam deflection device 115 and then propagate substantially vertically or parallel to a principal axis 116 of the laser processing unit 110 (parallel to the z-direction) or at more or less acute angles with respect thereto downwards in the direction of a workpiece 150 to be processed. The beam deflection device 115 has a plane-parallel substrate 117 consisting of synthetic fused silica, at which a plane surface is a reflective beam deflection surface 118 by virtue of it being coated with a dielectric coating that is highly reflective for the laser radiation. The arrangement of illuminated mask openings 109 in the mask plane 108 is imaged into the processing plane 122 of the laser processing unit with the aid of an imaging lens 120. The optical axis of the imaging lens 120 defines or corresponds to the principal axis 116 of the laser processing unit. The imaging can be magnifying, reducing or size-maintaining (1:1 imaging). In the example, the same intensity distribution as in the mask plane is present in the processing plane, but reduced in scale.

The laser processing station 100 comprises a workpiece movement system 200 designed to position a workpiece to be processed in a desired processing position of the laser processing station in reaction to movement signals of the control unit 190.

In the configuration in FIG. 1, the workpiece movement system 200 comprises a first substrate table 210, which can be moved parallel to the (horizontal) x-y-plane of the system coordinate system and also in the height direction (parallel to the z-direction) very accurately to a desired position and can also be rotated about a vertical rotation axis (PHI axis). For this purpose, precisely controllable electrical direct drives are provided in the example.

In the configuration in FIG. 2, a second substrate table 220 is arranged above the first substrate table 210 and can likewise be moved in a controlled manner in any desired directions horizontally (parallel to the x-y-plane) and also vertically (parallel to the z-direction) and can also be rotated about a vertical axis. The laser processing station 100 can contain both substrate tables, but in the method stage in FIG. 1 the second substrate table is not utilized and is therefore not illustrated.

The mask 107 is carried by a mask movement system (not illustrated), which, under the control of the control unit, allows a displacement of the mask 107 in the mask plane 108 (parallel to the y-z-plane) and also a rotation of the mask about an axis parallel to the x-direction.

In the situation in FIG. 1, the laser processing station 100 is designed for laser lift-off (LLO). Nowadays light-emitting diodes (LEDs), inter alia, are often produced by p- and n-doped semiconductor layers composed of gallium nitride (GaN) being formed on a sapphire wafer (epitaxial wafer), serving as a growth substrate, by epitaxial growth. The layers often only have thicknesses in the micrometer range and often have already been structured by laser processing to form individual functional elements 155 in the form of LEDs. A thin, usually metallic connection layer is applied to the GaN layer stack by vapor deposition, for example. With the aid of this connection layer, the growth substrate carrying the GaN layer stacks situated thereon is connected to a further flat carrier substrate. The areal connection between the growth substrate and the GaN stack is released later. As a result, the GaN stack is transferred to the carrier substrate.

The workpiece 150 in FIG. 1 shows the arrangement before the release of the areal connection. The upper flat substrate 152 is the growth substrate, which is also referred to as donor substrate 152 because later it donates the functional elements 155 applied thereon. The carrier substrate 154 bearing on the first substrate table 210 is also referred to as acceptor substrate 154 because it accepts or receives the functional elements 155. The acceptor substrate with the GaN stacks carried thereby then serves as a basis for the further steps of producing the microelectronic component.

In the laser lift-off method, the workpiece is positioned such that the processing plane 122 lies in the region between the donor substrate 152 and the GaN elements 155 to release the areal connection therebetween by laser processing. In this configuration, the buffer layer situated in the boundary region between the growth substrate and the GaN elements is destroyed or removed by laser radiation. The laser irradiation is effected through the laser-transparent growth substrate 152.

In a subsequent LIFT operation (cf. FIG. 2) the individual functional elements 155 held on the (acceptor) substrate 154 are then transferred to a further flat substrate 156. The latter is held in position by the first substrate table 210 and, at its top side to be equipped with micro-LEDs, already has an electrical supply structure (backplane) applied by vapor deposition and structuring. The bottom substrate 156 now serves as acceptor substrate. The acceptor substrate 154 from FIG. 1 carrying the microelectronic functional elements 155, proceeding from the arrangement there, is turned over such that now the functional elements 155 lie at the underside of the substrate. In this orientation the substrate now serving as donor substrate is held by the second substrate table 220 in FIG. 2 such that the functional elements to be transferred lie opposite the acceptor substrate 156. By laser beams being radiated in positionally accurately, the micro-LEDs are then detached from the donor substrate 154 and transferred to the acceptor substrate 156. The laser does not have an effect directly by way of radiation forces, but rather is utilized as a means for controlled energy input and triggers the material transfer in general thermally.

If the micro-LEDs are detached directly from the epitaxial wafer, then the energy comes from the pressure generated by the nitrogen being liberated as a result of the decomposition of a thin GaN layer.

The donor-acceptor spacing 158, which is a measure of the flight range of the functional elements 155 to be transferred, is generally between 30 μm and 500 μm, in particular between 80 μm and 200 μm.

In the production of micro-LED displays, for example, the workpiece movement system 200 has to be able to position the workpiece at a predefined target position possibly over relatively large travel distances of the order of magnitude of a few hundred millimeters with high positioning accuracy (of the order of magnitude of 1 μm or less). In the LIFT method, this is necessary for both substrate tables to be able to ensure the positionally correct transfer. An explanation is given below of some examples that enable such high positioning accuracies in an economic manner.

Figures 3A, 3B:
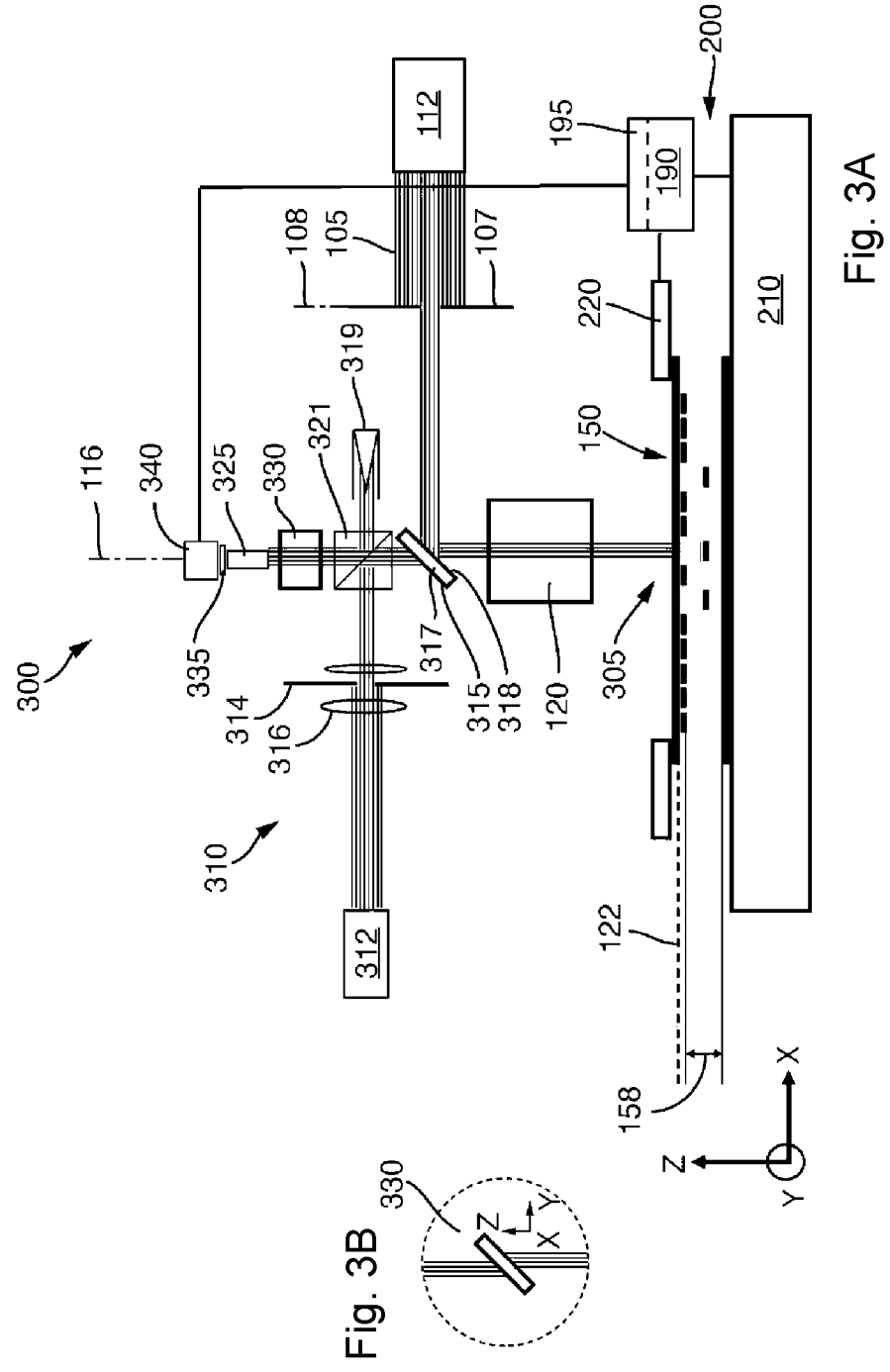
FIGS. 3A and 3B show an example of a laser processing station equipped with components that enable a camera-based position regulation, wherein narrowband green light is employed.

In the example in FIGS. 3A and 3B, some components that are also present in the reference examples in FIGS. 1 and 2 bear the reference signs used there.

The laser processing station 300 in FIGS. 3A and 3B is additionally equipped with optical, mechanical and software components that enable a camera-based position regulation.

These include components of an illumination system 310 for illuminating an illumination region 305 on the workpiece 150 with narrowband illumination light from a narrow wavelength range in the visible spectrum at a wavelength of approximately 528 nm, i.e., with green light. The illumination system is designed for Köhler illumination, which offers a homogeneous illumination of the zones to be illuminated in the illumination region 305 without imaging of the light source.

The green light source 312 can comprise one or a plurality of LEDs. A horizontal branch of the illumination beam path leads through a collector lens 316 and also a downstream luminous field stop 314 to a beam splitter cube 321, the plane beam splitter surface of which is inclined by 45° relative to the principle axis 116 of the laser processing unit 110. The beam splitter surface reflects a first portion of the illumination light in a direction parallel to the principle axis 116 downstream onto the workpiece 150. This portion passes through the plane-parallel substrate 317 (which is transparent to green light) of the beam deflection device 315, the dielectric coating of which has a highly reflective effect for the UV laser light, but has a high transmission for green light such that the illumination light impinges on the illumination region 305 on the workpiece through the laser lens 120.

Each point of the light source 312 illuminates the entire illuminated area on the workpiece, as a result of which a homogenization effect is achieved. The aperture of the imaging lens 120 represents the condenser stop and the imaging lens simultaneously functions as a condenser. This should be taken into account in the design of the system such that as far as possible only the region which is visible in the camera is illuminated and the lens is fully illuminated but not overexposed. This results in little stray light and maximum intensity of the (usable) illumination.

It is particularly expedient if the illumination is imaged into the aperture of the imaging lens 120 (laser lens) such that between 65% and a maximum of 90% of the aperture is illuminated and the luminous field stop is imaged into the processing plane 122 in reduced fashion via the laser lens such that the illuminated area is only slightly larger than the region imaged in the camera.

Portions of illumination light transmitted or allowed to pass through the beam splitter surface are trapped and absorbed by an absorber 319 and as a result cannot lead to unwanted stray light.

The light returning from the workpiece 150 passes once again through the imaging lens 120 (now functioning as a lens for camera observation), the beam deflection device 315 and the beam splitter cube 321 parallel to the principal axis 116 in the direction of a camera 340 having a high sensitivity for visible light, in particular for green light, in the example. A tube 325 is fitted upstream of the camera and has a light-absorbing property in its interior and functions as stray light absorber.

The optical arrangement is designed such that with the aid of the imaging lens 120 (and optionally further optical components) an image of the processing plane 122 is incident on the photosensitive sensor of the camera 340. The camera sensor thus lies in a plane optically conjugate to the processing plane 122.

The camera 340 is connected to the control unit 190 for the purpose of signal transmission. The control unit comprises an evaluation unit 195 for evaluating images of the camera by image processing. This evaluation is utilized in the context of the camera-based position regulation that will be explained later.

The beam deflection device 315 has a substrate 117 transparent to visible light in the form of a plane plate consisting of fused silica, for example, whose plane substrate surface facing the laser beam is coated with a dielectric coating. The latter has a highly reflective effect (reflectance R>99%) for the UV laser wavelength and has a relatively high transmission (transmittance T more than 20%, e.g., 50%-70%) for the green light of the illumination. As a result, the illumination light coming from the workpiece, in the observation beam path, passes parallel in an offset manner through the beam deflection device 315.

We established that an astigmatic distortion of the image of structural elements on the workpiece can also arise in this example, and can limit the spatial resolution capability. What causes this is, inter alia, the fact that the rays in the beam of rays do not all pass parallel to one another. One direction "sees" a varying plate thickness (X-direction) for beam portions with a varying impingement angle, and the other direction (Y) does not. This results in a distortion of the image in one direction.

To avoid disadvantages caused as a result of this, an astigmatism compensation unit 330 transmissive for illumination light is fitted between the beam deflection device 315 and the camera 340 in the observation beam path, the astigmatism compensation unit being illustrated from the y-direction in FIG. 3A and from the x-direction in the detail FIG. 3B. The astigmatism compensation unit is formed by a plane-parallel transparent plate tilted in relation to the principal axis 116 of the laser processing unit 110 by 45° about a tilt axis running parallel to the x-axis. By contrast, the beam deflection device 315 is tilted by 45° about a tilt axis that is tilted parallel to the y-direction, i.e., perpendicular to the tilt axis of the astigmatism compensation unit. As a result of the insertion of this second substrate (with the same thickness and composed of the same material and thus with the same optical thickness), the radiation that generates the image on the camera chip is treated in the same way in both beam axes such that the camera 340 can generate a substantially astigmatism-free image of the processing plane 122.

The arrangement can also be described such that the substrate of the beam deflection device 315 is an illumination light-transmitting plane plate that is at an angle of 45° in the laser beam and thus deflects the latter by 90° and that the astigmatism compensation unit comprises a plane plate 330 transparent to illumination light, which is at an angle of 45° in the observation beam path, but is arranged in a manner rotated by 90° with respect to the substrate 317 of the beam deflection device 315 in the axis of the observation beam path.

A narrowband bandpass filter 335 upstream of the camera 340 limits the illumination bandwidth utilized for image generation to approximately ±5 nm around the central wavelength of the green illumination light, which was already relatively narrowband before the filtering. Consequently, relatively only little intensity is lost as a result of the additional filtering around the central wavelength at the bandpass filter 335. A high-contrast image with particularly good resolution thus becomes possible in the example approximately 2 μm) even though the imaging lens 120 is not diffraction-limited for the green wavelength utilized and the two light-transmissive thick plane plates (beam deflection device and astigmatism compensator) are situated in the beam path. Ambient light and possibly radiation of a laser plasma or the like are thus also masked out.

A workpiece positioning operation can proceed with the aid of the camera-based observation as follows. First, in reaction to control signals of the control device 190, the workpiece movement system 200 positions a substrate table such that a predefined actual position should be attained for one predefined structural element or a plurality of predefined structural elements of the workpiece. The actual position must lie in the capture range or in the object field of the camera 340. At least one image of that portion of the workpiece which is illuminated by the illumination system and that lies in the capture range of the camera is then generated with the aid of the camera. The image or the images is or are evaluated by image processing to ascertain position data representing the actual position of the selected structural element in the capture range. For this purpose, the control device 190 comprises an evaluation unit 195 for evaluating images by image processing.

A comparison module is also implemented in the evaluation unit (by corresponding software), the comparison module comparing the ascertained actual position with a predefined target position of the structural element. If a location deviation or position deviation that cannot be afforded tolerance is present, then correction signals or corresponding correction values are generated, which indicate to the workpiece movement system how a correction movement should be carried out to bring the observed structural element to the target position or into sufficiently good proximity thereto. The workpiece movement system 200 then carries out the correction movement of the substrate table.

In processing that employs sectors, within a sector to be processed in the next step, in a predefined grid, images of the substrate are recorded and processed and position values are calculated. The difference between actual value and target value is each written to a correction table used for correction purposes during the processing, the values between the points of the grid being interpolated. If no position deviation is present, there is a 0 in the table.

The system is programmed such that the laser processing by radiating in laser radiation begins only when the positioning into the target position (if appropriate including the required correction movement) has been concluded. In this example, the workpiece is stationary, i.e., is not moved.

Figures 4A, 4B, 4C:
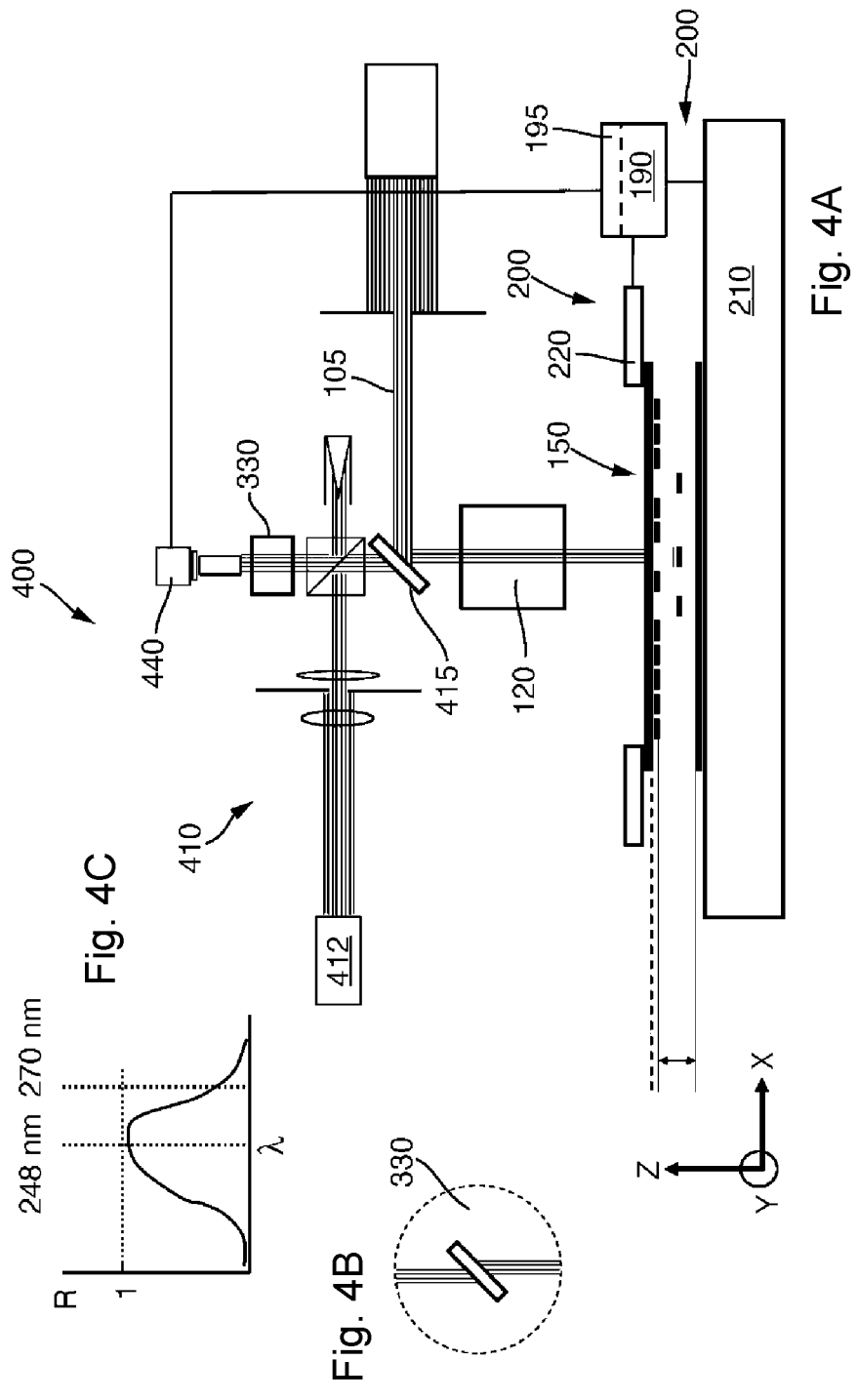
FIGS. 4A, 4B and 4C show an example of a laser processing station equipped with components that enable a camera-based position regulation, wherein ultraviolet light is employed.

With reference to FIGS. 4A-4C, by way of example an explanation will now be given of how the achievable spatial resolution and the positioning accuracy can additionally be improved by some modifications to the set-up from FIGS. 3A and 3B. Some elements of the laser processing station 400 which are identical or substantially identical in FIGS. 3A, 3B and 4A-4C bear the same reference signs as in FIGS. 3A and 3B.

An improvement is achievable inter alia if the camera observation is effected with radiation from the ultraviolet range. In the example in FIG. 4A, a camera 440 is used which is sensitive in the ultraviolet wavelength range (UV camera). Furthermore, an illumination system 410 with an illumination light source 412 which works within the ultraviolet wavelength range is used. In this regard, an LED with a wavelength of 270 nm can be used as illumination light source, for example. This wavelength is indeed close enough to the laser wavelength (248 nm) that, for example, the antireflection coatings in the imaging lens 120 are highly effective for the illumination radiation as well. At the same time, however, at the beam deflection device 415 it is possible to provide a dielectric coating which has a highly reflective effect for 248 nm, while it is already sufficiently transparent (sufficient transmittance) for the illumination wavelengths of 270 nm (cf. reflectivity diagram in FIG. 4C).

Figures 5A, 5B, 5C:
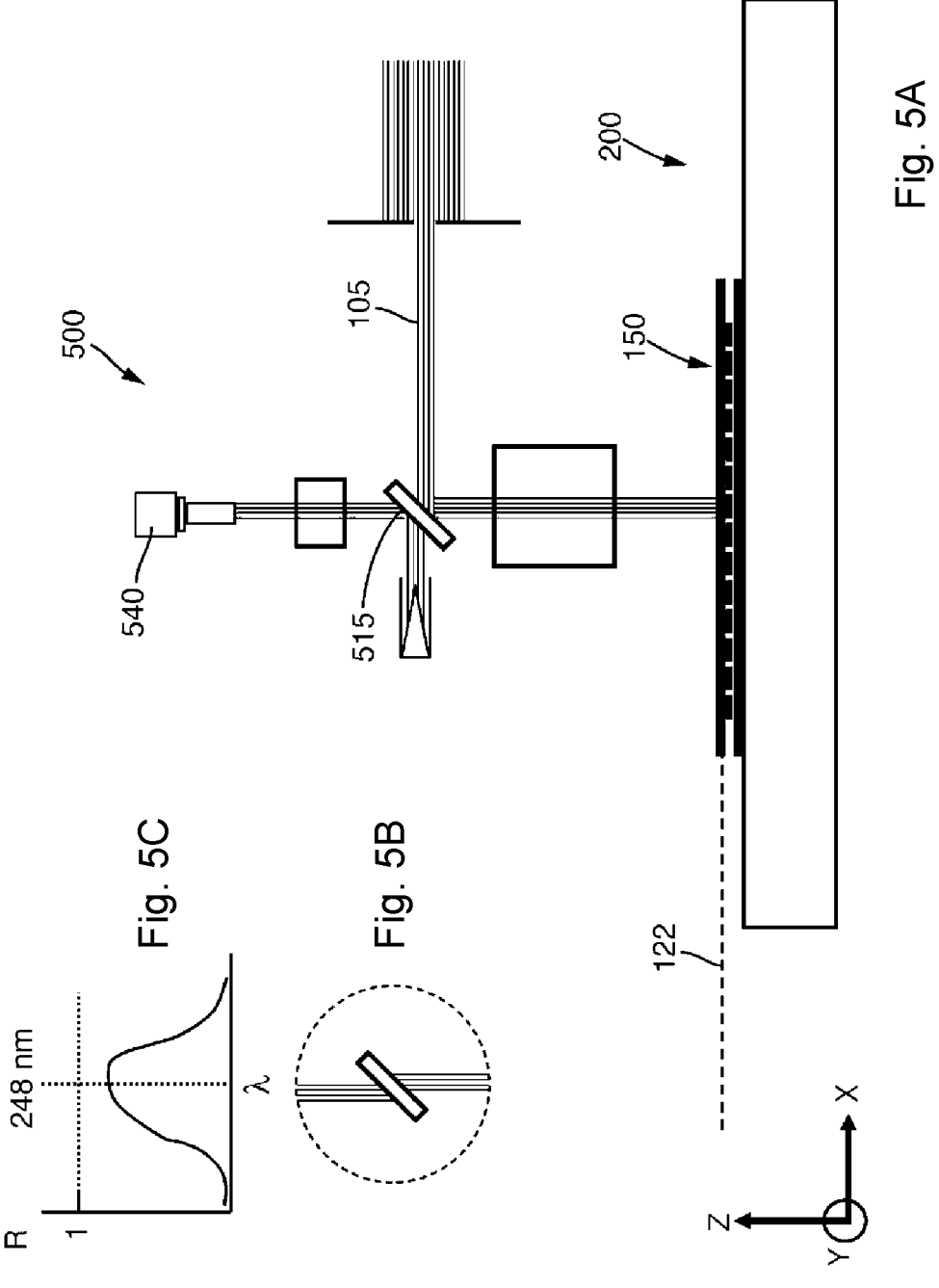
FIGS. 5A, 5B and 5C show a laser processing station for a laser lift-off operation with UV camera and the possibility of in-situ observation of the micro-LEDs to be transferred.

FIG. 5A shows a laser processing station 500 for a laser lift-off operation with a UV camera 540 and the possibility of in-situ observation of the micro-LEDs to be transferred. This example is taken as a basis for explaining how, through the use of a camera 540 sensitive in the ultraviolet wavelength range, the observation of the processes in the processing plane 122 can also take place directly at the laser wavelength used (here 248 nm). To achieve this, a dielectric laser deflection mirror is used in the beam deflection device 515, the mirror having a sufficient and defined transmission in the ultraviolet range used, e.g., at 248 nm. For this purpose, this beam deflection mirror can be designed as a physical beam splitter that transmits a small, defined portion of the laser radiation on the path from the workpiece 150 to the camera 540. For this purpose, it is possible to exploit the fact that, in principle, every dielectric mirror has a residual transmission for the wavelength used, which fundamentally cannot be avoided. Better mirrors, i.e., mirrors with a high reflectance, have relatively little residual transmission. It is possible to use a dielectric mirror having a residual transmission sufficient for recording an image using a UV-sensitive camera 540. Preferably, in the beam deflection device, a dedicated physical beam splitter is used, i.e., a dielectric coating having a relatively high, defined reflectance for the laser wavelength and at the same time a transmittance likewise defined with high accuracy for this laser wavelength at the angles of incidence that occur (around) 45°. By way of example, beam splitters with a transmission of approximately 0.5% to approximately 5% can be utilized (cf. reflectivity diagram in FIG. 5C).

The laser processing becomes particularly efficient and precise if the work is done step by step and it employs sectors. Such method variants comprise generating and storing a grid of correction values within a measured sector and processing this sector afterwards as prompt as possible. In this example, the corrected values are utilized for the laser processing of the workpiece. Afterwards, a next sector is correspondingly measured, processed and the like.

In one example, the processing is initially effected in a defined portion (sector) of the entire travel range of the various movement systems. This can mean, e.g., that a 6 inch wafer is not processed in one step, rather each smaller sectors of, e.g., 25×25 mm² or 16×16 mm² or 22×27 mm² are processed step by step. Before the processing in such a sector, the movement systems in this sector are currently measured and corrected. For the image processing, the coordinate table should be stationary or move so slowly that no disturbing motion blur occurs. However, only a grid within the sector is recorded (e.g., 5 positions in the X-direction times 10 positions in the Y-direction), and not the entire area of the workpiece within the sector and not all processing positions either. In this example, images are recorded continuously in the predefined grid and the image processing and calculation of the correction values are effected in parallel therewith during the recording of the images at the next positions. The values between the measured positions are then interpolated during the processing. The necessary number of measurement positions is dependent on the error occurring and can be optionally dynamically adapted.

After the processing in a first sector, a second sector is measured and then processed such that the measurement and processing always take place promptly one after the other. Deviations that only occur within the complete processing can thus be concomitantly corrected. That is to say that when the correction is ready, processing is effected and the change should take place automatically. Optionally, the operator can be informed and asked for confirmation if unusual, implausible deviations are measured.

Besides an exact positioning of the workpiece or of the structural elements thereof in space, on the part of the laser processing unit, too, properties of the laser beams (e.g., position in space, edge steepness, homogeneity over the beam cross-section and the like) are likewise crucial for achieving extremely high precision of the processing. Likewise, for the LIFT operation, for example, an exact alignment of the mask apertures with the micro-LEDs on the donor substrate and also an exact setting of the position of the imaging are essential for correct processing.

Figure 6:
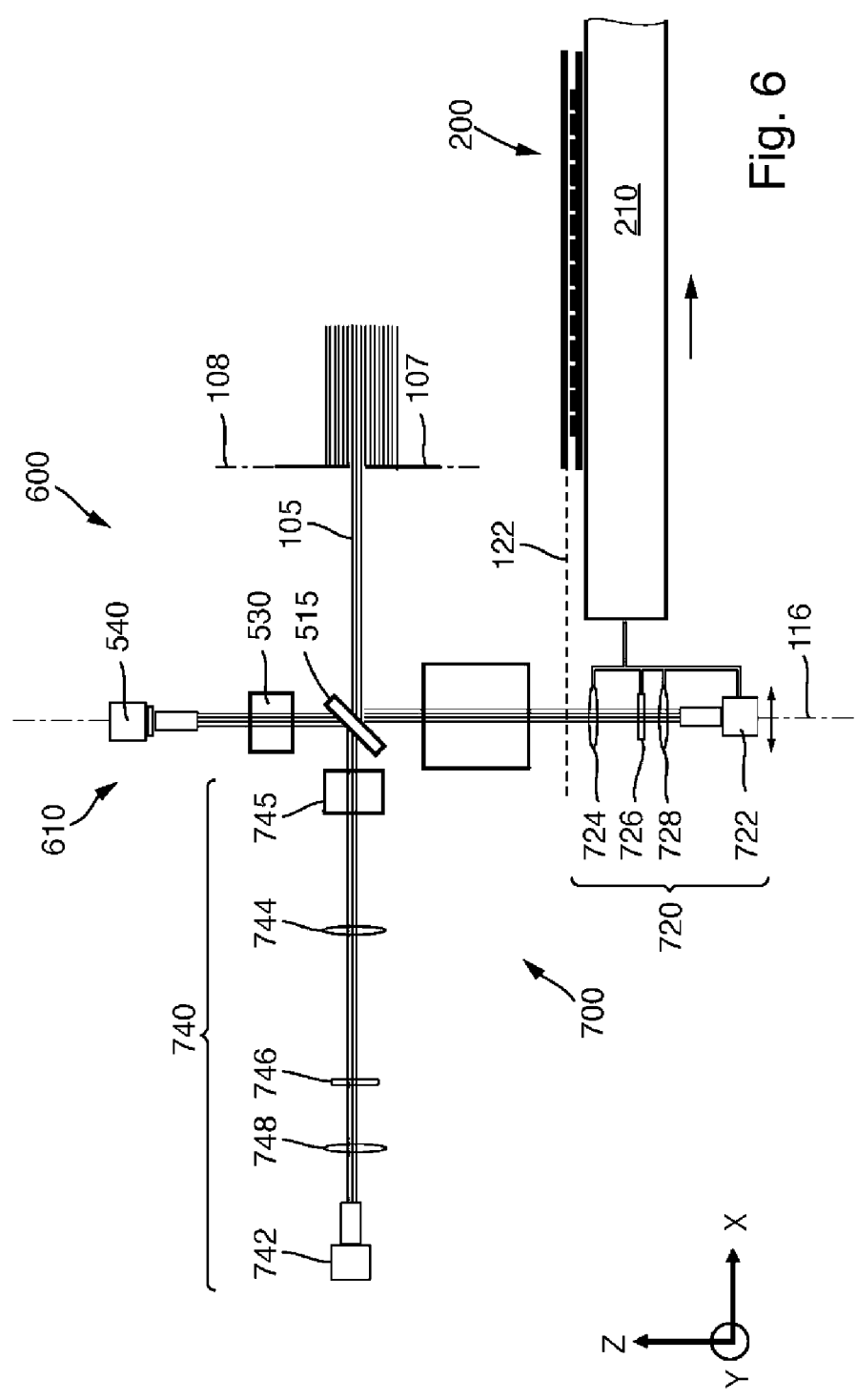
FIG. 6 shows examples for beam diagnosis systems integrated into the laser processing station, where some beam analysis units that are able to be utilized alternatively or cumulatively are illustrated schematically in a single illustration.

With reference to FIG. 6, some possibilities for beam analysis or for beam profiling are illustrated schematically in a single illustration. In this example, some basic components of the laser processing units correspond to those in FIG. 5A, inter alia the laser, the mask 107 in the mask plane 108, the beam deflection device 515 and also the camera 540 sensitive to UV radiation and the astigmatism compensation unit 530 arranged between the camera and the beam deflection device.

Components of a camera-based beam analysis system 700 are additionally provided, which are integrated into the laser processing station 600 and are designed to carry out an in-situ analysis of beam properties of the laser beam 105. The illustration shows components of a first beam analysis unit 720 and also of a second beam analysis unit 740, which can be provided as an alternative or in addition to the first beam analysis unit.

The components of the first analysis group 720 are fitted below the processing plane 122 in a continuation of the laser beam impinging there, i.e., in a continuation of the principal axis 116 of the laser processing unit 610 such that the laser beams can strike the beam analysis unit when the substrate table 210 of the movement system 200, as illustrated, is moved laterally to an extent such that it no longer blocks the beam path. With the aid of the first beam analysis unit 720, the intensity distribution in the processing plane 122 is imaged onto a planar UV-VIS converter 726 by a lens 724 with a suitable imaging scale. The converter is arranged in an optically conjugate plane with respect to the camera sensor of the camera 722. The image of the UV-VIS converter is imaged via a further lens 728 onto the camera chip (which is sensitive to visible light) of the camera 722 (VIS camera).

In an alternative example, a camera sensitive to UV light (UV camera) is used. The interposed UV-VIS converter and also the intermediate imaging utilizing it can then be omitted.

For diagnosis of the complete mask structure of the mask 107, the camera 722 is moved in the step-and-repeat method step by step parallel to the processing plane 122 (i.e., parallel to the x-y-plane) into different measurement positions over the irradiated region of the processing plane. Respective individual images are captured. The individual images are combined by software to form the image of the complete mask and evaluated by image processing.

One advantage of this example is that the complete beam path from the laser as far as the processing plane 122 is contained in the diagnosis and accordingly any error in one of the components from the laser as far as the processing plane can be identified. Moreover, the region downstream of the processing plane, i.e., the first analysis group 720, does not contain more components than are absolutely required for the measurement.

In accordance with one example, a measurement and correction of the camera positioning for the beam analysis can be effected using a high-precision lithographic mask structure, which is imaged into the processing position in the processing plane 122 with the aid of the laser apparatus or laser processing unit 610. After recording of mask apertures at various positions of the beam analysis camera, and combination of the individual images by software to form an image of the complete mask, it is possible to determine and correct positioning errors on the basis of the errors in the image of the mask in the boundary region between the individual images by image processing. At the positions where adjacent images are joined together, this can reveal a deviation from the original structure that represents a measure of the relative positioning error in X- and Y-directions (in each the sum of the X- and Y-errors at the two positions where the images were recorded). After these deviations have been calculated, a possible error can then be compensated for.

So that a measurement of the position of a mask is possible at any time, the components of the beam analysis system 720 can be mounted at the positioning device 200 or outside the substrate holder 210 or on a separate positioning unit. In this example, the precise positioning of the beam analysis system in the sub-μm range forms the prerequisite for the exact combination of the individual images and thus the correct analysis of the laser beam in the processing plane 122. A fine calibration of the positioning is therefore very important in this range.

Alternatively or additionally, a second beam analysis unit 740 can be provided. Its components are arranged in a straight continuation of the laser beams 105 behind the beam deflection device 515 acting as a beam splitter. The optical axis of the second beam analysis unit 740 runs perpendicular to the principal axis 116 of the laser processing unit. The set-up with camera 742, optional imaging lens 748, optional UV-VIS converter 746 and lens 744 is analogous to corresponding components of the first beam analysis unit 720. Between these components and the inclined transparent plane plate of the beam deflection device 515, an astigmatism compensation unit 745 with an inclined plane plate analogous to the astigmatism compensation unit 530 is also inserted since the laser beam incident in the second beam analysis unit 740 has passed through the inclined plane plate of the beam deflection device 515 and experienced astigmatic changes in the process, which are intended to be compensated for.

An advantage of the second beam analysis unit 740 is that it can also be used during the laser processing for monitoring the laser beams and/or the mask 107, for example, for quality assurance purposes. A disadvantage is that possible aberrations in the imaging lens 520 might not be ascertained by the second beam analysis unit.

The set-up with a UV camera 540, that set-up also being present in other examples, likewise allows a beam analysis or beam profiling to be carried out. For this purpose, a strongly and uniformly scattering auxiliary substrate can be brought into the processing plane 122. The energy distribution on this strongly scattering plane is then imaged into the camera 540. An alternative method of beam profiling is possible if a plane mirror is brought into the processing plane 122. In that example, as an alternative to the UV camera 540, it is also possible to use a UV-VIS converter in combination with a VIS camera.

The beam diagnosis including the measurement and optionally correction of the position of the mask apertures is an important part of measures that can be taken to ensure overall the highest possible accuracy of the processing.

Figure 7:
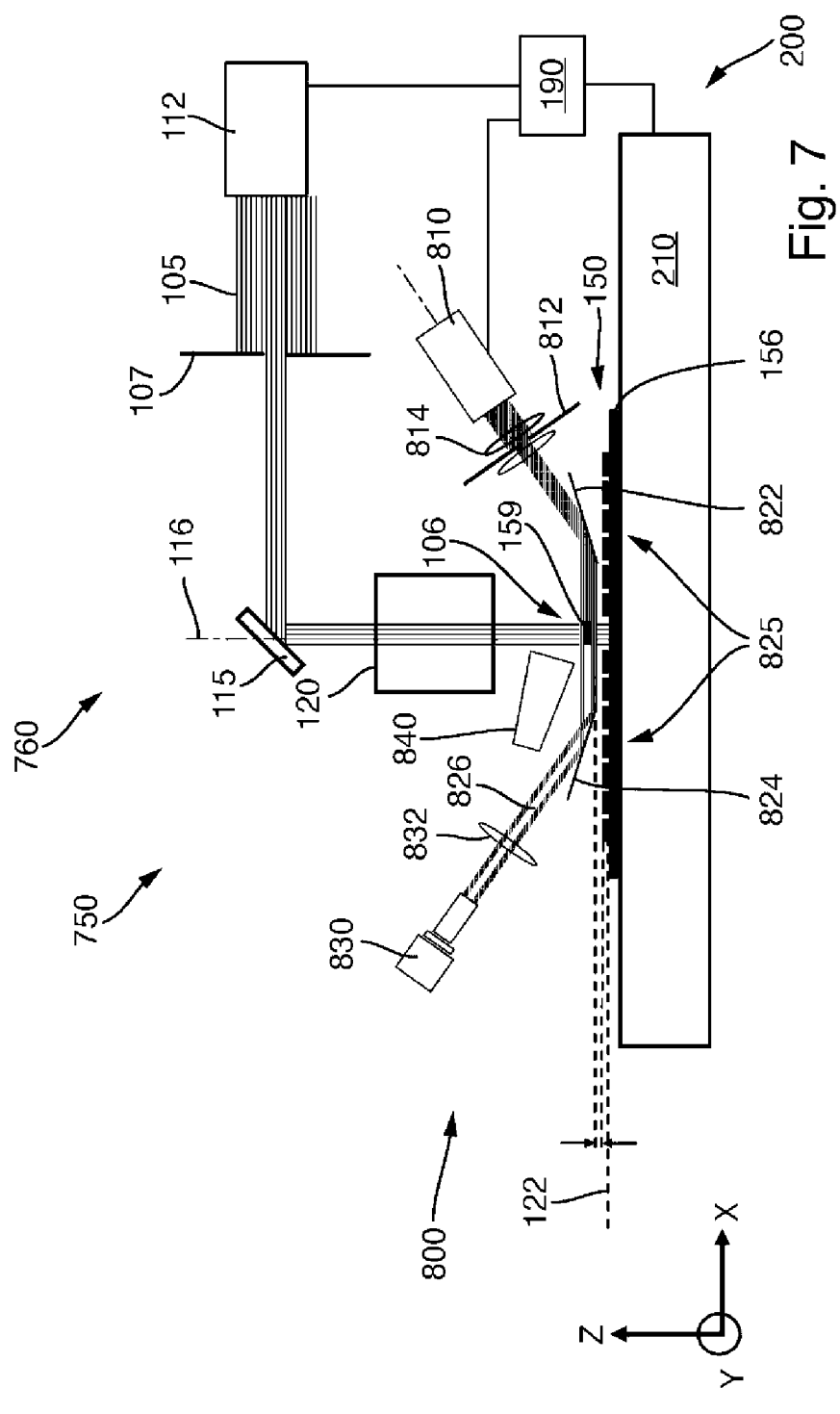
FIG. 7 shows an example of a laser processing station into which a shadowgraphy system is integrated.
Figure 9:
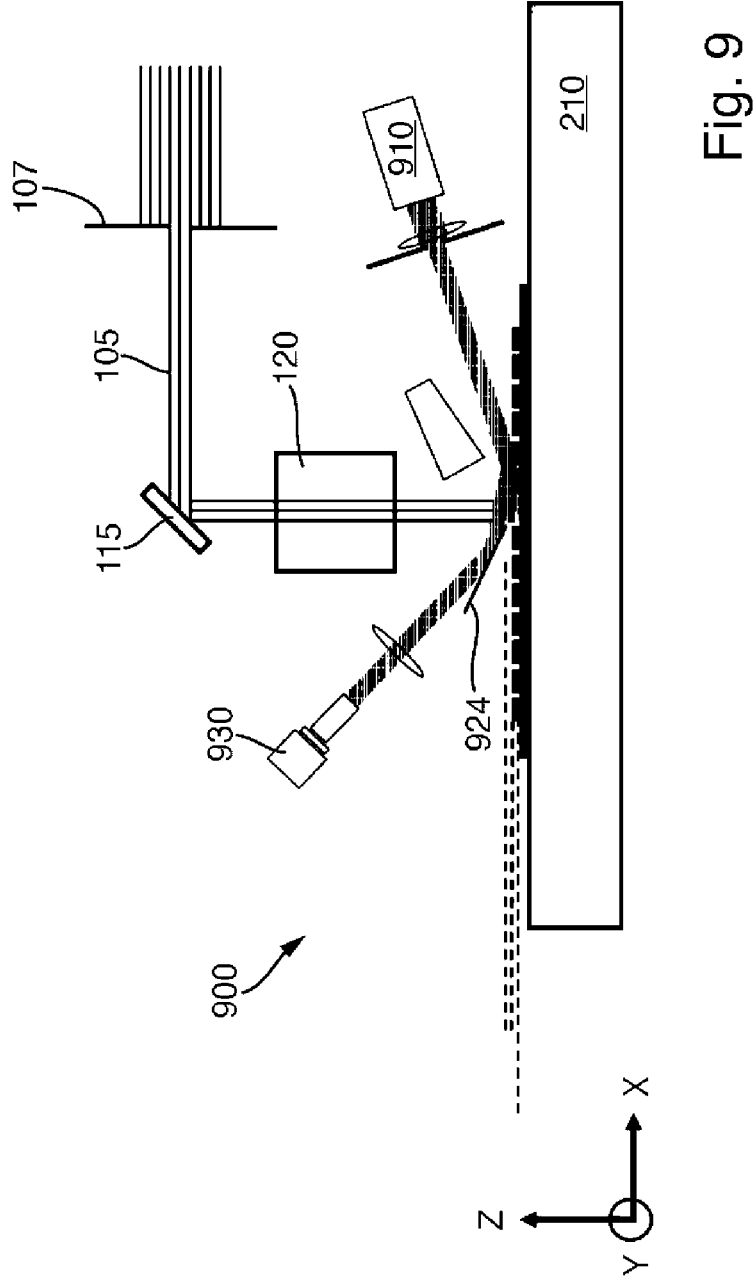
FIG. 9 shows an example of a laser processing station into which a shadowgraphy system is integrated which is designed for the observation of the region near the sample including the sample surface.

With reference to FIGS. 7 and 9, an explanation is given below of further possibilities for equipping a laser processing station, e.g., for the fabrication of micro-LED displays such that displays can be fabricated with high precision and high yield.

FIG. 7 schematically shows an example of a laser processing station 750 equipped with components of a shadowgraph analysis system 800, which may also be referred to as a shadowgraphy system 800. It is thereby possible to observe in situ, i.e., during the laser processing, rapidly proceeding processes in the region of the processing zone 106, i.e., where laser radiation impinges on the workpiece 150 and interacts with the latter.

In this respect, FIG. 7 schematically shows a possible set-up for shadowgraphy during a LIFT operation for repair processes. In the repair process illustrated, the intention is to remove a defective pixel or a defective "die" 159 from a display substrate 156 equipped with a multiplicity of pixels of identical type and at the same time to observe the processes during the detachment. For this purpose, the shadowgraphy system comprises a short-pulse light source or flash light source 810 that can emit very short light pulses (typical lengths of down to 30 ns to 100 ns) of sufficient intensity. For this purpose, provision is made of LEDs that can supply the necessary brightness of the illumination pulses as a result of high current (possibly more than 100 A) during the short exposure time. The short illumination light pulses can be triggered by the laser pulses of the laser processing unit 760. For this purpose, the control unit 190 contains a delay unit, which makes it possible for light pulses to be emitted only after predefined delay times after a laser pulse to be able to observe the processes during detachment of a die within short times after the impingement of the laser pulse.

A collector stop 812 and a collector lens element 814 of the shadowgraphy illumination are disposed downstream of the short-pulse light source 810. The illumination beam path proceeding from the light source firstly runs obliquely with respect to the processing plane 122, for example, at an angle of 20° to 50° with respect thereto such that the short-pulse light source and the downstream components can be positioned relatively close to the processing zone without colliding with the workpiece.

To achieve the effect that the illumination light in the region of the processing zone 106 passes through the processing zone parallel to the processing plane 122, a first deflection mirror 822 of a mirror system 825 is arranged between the short-pulse light source and the processing zone. The mirror element is in a wedge-shape and thus allows that end edge of the deflection mirror near the processing zone to be arranged at a very small distance from the processing plane. The distance can be 50 µm to 200 µm, for example.

At the opposite side with respect to the first deflection mirror 822, the mirror system 825 comprises a second deflection mirror 824 that can be arranged mirror-symmetrically with respect to the first deflection mirror 822 in relation to the principal axis 116 of the laser processing unit and deflects the light that has passed through the processing zone 106 parallel to the workpiece into a direction running obliquely with respect to the processing plane 122 to a camera 830. If, during the laser ablation, a detached particle in the region of the processing zone 106 flies through the illumination beam path, light is blocked and a shadow 826 is produced within the illumination beam path. An extraction device 840 extracts detached particles from the processing zone by suction.

At the opposite side with respect to the short-pulse light source, provision is made of a camera 830 for capturing shadowgraphs of the processing zone. The optical axis of the camera is oriented obliquely with respect to the processing plane (angle of 30° to 60°, for example). On account of the oblique orientation, the camera 830 can be brought very close to the processing zone without colliding with the workpiece. A lens 832 for imaging the detached die onto the chip of the camera is arranged between the camera and the deflection mirror.

The shadowgraph analysis system 800 can be configured such that, in a manner triggered by laser pulses of the laser 112, images are generated with a multiplicity of temporally offset illumination pulses and are evaluated. In one example, the system is designed to observe particles having typical sizes of 3 µm to 30 µm. The multiple exposure allows tracking of the trajectory such that the particle or the micro-LED is able to be recognized multiply in the captured images, specifically at different times at different positions. In an experimental set-up, it was possible to observe particles with velocities of up to 8 m/s (80 m/s with significant motion blur) and to capture and analyse their trajectory.

A repair process can be realized as follows, for example. The display 150 (workpiece 150) to be assessed is controlled and measured and each pixel or each micro-LED is rated. Micro-LEDs which remain dark, for example, or the luminance of which is outside the specification are deemed to be defective. A table or matrix identifying the positions of all defective dies is produced.

A computing unit of the control unit 190 calculates movements or a contour over the display that links the positions of all defective pixels. This contour is progressively traversed by control of the movement system. Laser pulses are triggered at the respective positions of defective dies. In this example, the die 159 detaches from the display substrate, is accelerated and reaches the extraction device 840. This gives rise to vacancies at the positions of the defective dies, these vacancies being equipped with new dies. Thus, new (defect-free) dies are not stacked onto defective dies that have still remained.

The shadowgraphy system enables observation and monitoring of these method steps. The realization of 100% monitoring is made possible by the mirror system 825, inter alia, whose components near the workpiece are positioned at a distance of, e.g., approximately 50-200 μm over the processing plane (sample surface) and can be arranged laterally, for example, fixedly with respect to the imaging lens 120 of the laser processing unit configured for a LIFT process.

For quality assurance in the repair application, a solution with relatively low optical resolution can be used to make a larger region of the processing zone visible and to allow an observation of the processing zone while the equipped display substrate is moved under the laser processing unit 760 with the aid of the movement system 200. It is possible to clarify, inter alia, whether a die has been detached and accelerated. If appropriate, a new laser pulse can be triggered if this does not occur. The observation also makes it possible to establish whether the defective dies definitely reached the extraction device 840. Otherwise, it is possible to create a note in the fault log. The use of a shadowgraph analysis in the context of repair processes, for example, during the production of micro-LED displays can thus contribute to producing practically fault-free displays.

A repair can also already be carried out on a transfer substrate. That can be expedient because there is no risk of damaging the backplane.

The high benefit achievable as a result can be understood as follows. A modern 8K display contains approximately 100 million micro-LEDs. Experience shows that the introduction of a new technology is accompanied by a reduced yield during fabrication, the so-called "yield loss," which is then considerably reduced in the context of a learning curve as production is ramped up. A completed display may initially contain a few thousand defective pixels, for example. To nevertheless obtain a fault-free product, repair processes are carried out to exchange these defective elements. The defective elements are firstly removed again. This can be done efficiently using a LIFT process. Even with a totally established process, repair processes are expected to be permanently an expedient supplementation for the production process.

Another possibility for the utilization of shadowgraph analysis in the context of LIFT processes is explained with reference to FIG. 8. In this example, the components of the shadowgraph analysis system 800 bear the same reference signs as the corresponding components in FIG. 7, for reasons of clarity. In contrast to the arrangement in FIG. 7, the mirror system is absent. The short-pulse light source 810 and the camera 830 fitted at the opposite side have coaxial optical axes running perpendicular to the principal axis of the laser processing unit 760 such that the illumination beam path of the shadowgraph analysis system runs parallel to the processing plane 122 upstream and downstream of the processing zone. The arrangement can be utilized for parameter control of the laser parameters for high-resolution shadowgraphy during a LIFT operation. In this example, only a relatively small-area sample 750 is analysed, rather than a complete wafer or a complete display. The observation runs parallel to the sample surface without mirrors. An observation is possible beginning directly with the detachment from the donor surface by virtue of the fact that the illumination light is at practically no distance from the sample surface. An observation with high resolution can be achieved by virtue of the fact that there can be a distance of only a few centimeters between the short-pulse light source 810 and the camera 830 on the capture side. The observable region can be relatively small. The design can expediently be such that the observation region is only slightly larger than the maximum donor-acceptor spacing. An observation of a distance of a maximum of 500 μm, optionally also significantly less, for example, down to 100 μm or less, is usually sufficient.

Figure 8:
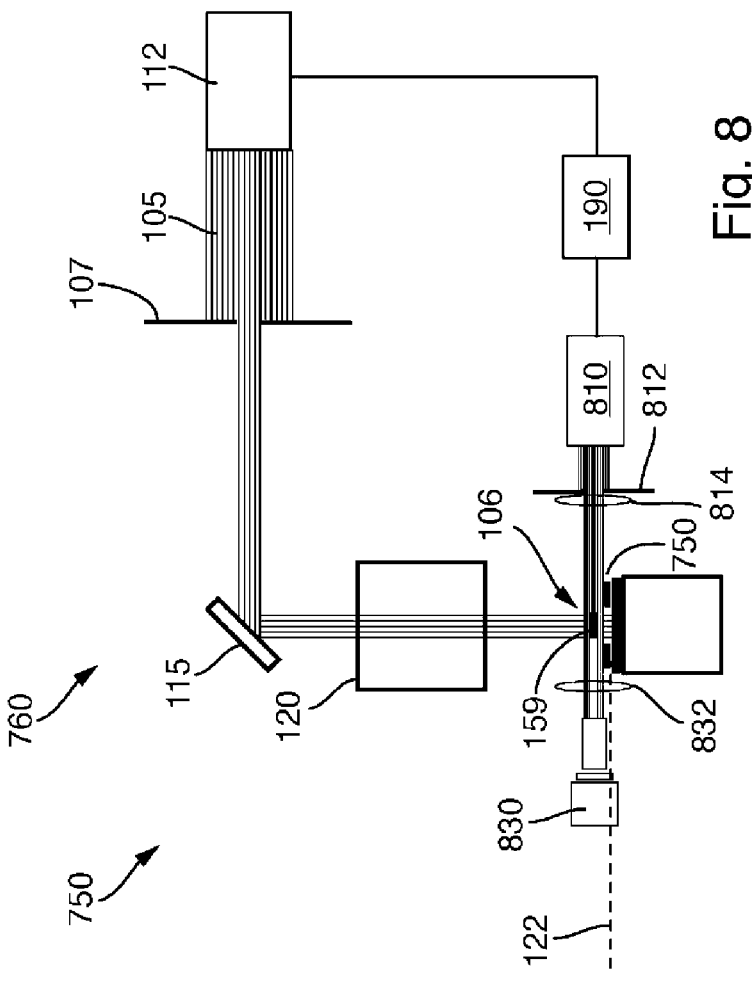
FIG. 8 shows another example of a laser processing station into which a shadowgraphy system is integrated.

In the arrangement in FIG. 8, the lower edge of the illumination beam path is arranged, e.g., approximately 100 μm over the sample surface, and the detached die can also only be observed starting from this position. A development of the shadowgraph analysis system 900, illustrated in FIG. 9, is configured to observe the region from the sample surface to a height of approximately 500 μm. For this purpose, the radiation of the short-pulse light source 910 is directed onto the sample surface (workpiece surface) in the region of the processing zone 106 at a shallow angle (e.g., 10° to 30° such that the relatively highly reflective sample surface functions as a deflection mirror. The deflection mirror 924 arranged behind the processing zone on the side of the camera 930 is inclined downwards slightly (compared to the deflection mirror 824) such that the dies in the processing zone become visible in the lower region of the camera image. The radiation of the short-pulse light source 910 is then deflected by the sample surface to the deflection mirror 924 of the camera and is then imaged onto the chip of the camera 930. With application of this set-up, although the shadowgraphy beam path no longer runs exactly parallel to the sample surface, it is possible to monitor the entire region beginning with the sample surface with only little distortion of the imaging. Consequently, the process of the detachment of the die from the sample surface can likewise be visualized and assessed.

With the aid of knowledge from the shadowgraph analysis, the laser parameters can be set such that the particles to be detached (dies, μLEDs or the like) fly to the acceptor parallel to one another substantially without inherent rotation or lateral offset to ensure the required accuracy. The observation of the flight behavior can be effected depending on laser parameters and also on the nature of the epitaxial wafer and other parameters. The observation within a narrow strip is generally sufficient for this. The shadowgraph analysis makes it possible to identify those parameters which ensure a LIFT process with high quality. The set-up can be utilized for monitoring the production process in the manner of random sampling to identify possible quality problems.

We conducted complex analyses and considerations of potential errors. We found that the sum of all errors to be considered should remain below approximately 1.5 μm to achieve the highest processing accuracy currently foreseeable. As a maximum tolerable error, the width of the streets between the μLEDs may be regarded as a guideline value since, in the an even larger error, the adjacent μLED would be concomitantly irradiated at the margin. The edge steepness of the imaging, that is to say that region at the boundary of the mask aperture in which the laser energy falls from 90% to 10%, must also be subtracted from this maximum tolerance error. The edge steepness is associated with the properties of the lens used and may be 1.6 μm, for example. If the width of the streets is, e.g., 3 μm, this results in a maximum permissible deviation between the imaging of the mask apertures in the processing plane and the position of the associated μLED of 1.4 μm. It is evident from this that any substep that improves the precision can be important, even if it can only avoid errors of the order of magnitude of tenths of a micrometer.

Further measures may optionally be useful to further increase the processing precision. For example, there may be differences in the sensitivity of the individual pixels in camera systems. This may impair the quality of combined images, especially when these are generated from individual images. A pixel sensitivity correction may be advantageous in this example. By way of example, a correction can be achieved by virtue of the same region of a known intensity of the laser beam being measured multiple times using different pixels as a result of an incremental offset on the camera and the differences then being compensated. The laser stability may also play a role when combining (or stitching) combined images from individual images. Thus, there may be small differences between the individual pulses. An increase in accuracy can be obtained by averaging by a suitable filter. The illumination required for the camera observation may lead to a local introduction of energy in the system, and a migration of images caused thereby. Image migration due to heating up may, for example, be suppressed or avoided by virtue of an intermittent illumination being used instead of a continuous illumination, for example, by illumination pulse width modulation. Another solution provides for the use of an additional off-axis camera system with optionally a higher resolution and with an illumination, the off-axis camera system being arranged spatially next to the processing lens. Then, the observation is thus implemented before or after the processing.

The invention claimed is:

1. A method of producing a microstructured component comprising a multiplicity of micro-functional elements on a substrate comprising laser processing in at least one method stage in a laser processing station under control of a control unit, the laser processing comprising parallel processing at a multiplicity of processing locations, a mask with a multiplicity of mask openings being used, the mask splitting a laser beam into a multiplicity of partial beams and the mask openings emitting laser radiation being imaged onto a processing plane of a laser processing unit, the laser processing comprising at least one of a Laser Lift-Off (LLO) operation selectively removing one material from another material and a Laser-Induced Forward Transfer (LIFT) operation configured to transfer material onto the substrate by directing laser radiation with positional accuracy on the material, the method stage comprising positioning a workpiece to be processed in a processing position of the laser processing station by a workpiece movement system in reaction to movement signals of the control unit, the workpiece being one of a substrate that has not yet been processed and a substrate carrying at least one of a coating and other functional structures, the method comprising:

observing the workpiece in a camera-based manner by a camera system, the observing comprising capturing at least one portion of the workpiece lying in the object field of a camera and also generating an image representing the portion;

evaluating the image by image processing to ascertain position data representing an actual position of at least one structural element of the workpiece in the object field;

comparing the actual position with a target position of the structural element and generating correction signals depending on a deviation of the actual position from the target position;

correcting the processing position by controlling the workpiece movement system to match the actual position to the target position based on the correction signals; and radiating in at least one laser beam directed at the workpiece to locally laser process the workpiece at at least one processing location of the workpiece.

2. The method according to claim 1, wherein the workpiece is divided into a multiplicity of sectors and the sectors are processed successively step by step, within a measured sector a grid of correction values being generated and stored and subsequent processing of this sector utilizing the values corrected with the aid of the correction values for the laser processing of the workpiece.

3. The method according to claim 1, wherein narrowband light is utilized for the camera observation and image capture, the light utilized for the image capture having a spectral bandwidth of 10 nm or less, at least during the capture of an image an illumination region that includes the object field of the camera on the workpiece being illuminated with narrowband illumination light and/or only light from a narrow wavelength band, being transmitted to the camera by a wavelength-selective device between the object plane of the camera and the camera.

4. The method according to claim 1, wherein the observation and image processing are realized within a correction step before the laser processing and the laser processing step is only started after the corrected processing position has been set, the workpiece not moving during the image capture such that the measurement for the correction is effected with the workpiece stationary.

5. The method according to claim 1, wherein the laser processing unit comprises an imaging lens for imaging a mask plane into a processing plane of the laser processing unit and in that the positioned workpiece is observed by the camera through the imaging lens, a beam deflection device with a beam deflection surface oriented obliquely with respect to a principal axis of the laser processing unit being provided, which deflects the laser beam in a propagation direction running substantially parallel to the principal axis, the positioned workpiece being observed by means of the camera through the beam deflection surface.

6. The method according to claim 1, wherein, to laser process a laser wave-length in an ultraviolet range, of approximately 248 nm is utilized and illumination light is used having an illumination wavelength in the ultraviolet range, an illumination wavelength of less than 300 nm being used, attenuated light of a laser light source utilized for the laser processing being used for the illumination of the workpiece, or to laser process a laser wave-length in the ultraviolet range of approximately 248 nm, is utilized and illumination light is used having an illumination wavelength in the visible spectral range (VIS).

7. The method according to claim 1, further comprising a beam analysis integrated into the laser processing station of the laser radiation in the processing plane to determine the positions of images of the mask apertures in the processing plane, a control of the workpiece movement system being carried out such that the position and orientation of each mask aperture in the processing plane in each laser pulse corresponding to the position and orientation of a structural element to be processed and/or a measurement and correction of the camera positioning for the beam analysis being effected using the mask structure imaged into the processing position with the aid of the laser apparatus, after a recording of mask apertures at different positions of the beam analysis camera individual images being combined by software to form an image of the complete mask and positioning errors being determined and corrected on the basis of the errors in the image of the mask in the boundary region between the individual images by image processing.

8. The method according to claim 1, further comprising a beam diagnosis of the laser radiation, said beam diagnosis being integrated into the laser processing station, wherein the camera system for observing the workpiece is used for the beam diagnosis by virtue of an auxiliary substrate that reflects or greatly scatters the laser radiation being fitted in the processing plane.

9. The method according to claim 1, wherein the camera system for observing the workpiece is additionally used for the monitoring of the laser processing by virtue of the camera system being triggered with the aid of trigger signals of the laser processing.

10. The method according to claim 1, further comprising an in-situ observation and analysis of rapidly proceeding processes in the region of the processing zone influenced by a laser beam by shadowgraph analysis, trajectory tracking being carried out which involves ascertaining and analyzing the trajectory of a part detached from the workpiece by a laser pulse.

11. A system that produces a microstructured component comprising a multiplicity of micro-functional elements on a substrate that carries an array of pixel-forming micro-light-emitting diodes on an electrical supply structure, comprising:

a control unit;

a laser processing station with a laser processing unit controllable by the control unit;

wherein the laser processing station is configured to perform at least one of a Laser Lift-Off (LLO) operation selectively removing one material from another material and a Laser-Induced Forward Transfer (LIFT) operation configured to transfer material onto the substrate by directing laser radiation with positional accuracy on the material;

the laser processing unit comprising a mask having a multiplicity of mask openings, the mask being arranged in a mask plane and configured to split a laser beam into a multiplicity of partial beams, the mask openings emitting laser radiation being imageable onto a processing plane of the laser processing unit, so that the laser processing unit is configured for parallel processing at a multiplicity of processing locations, the laser processing comprising:

a workpiece movement system that positions a workpiece to be processed in a processing position of the laser processing station in reaction to movement signals of the control unit;

a camera system with a camera that observes the workpiece, the camera system designed to capture at least one portion of the workpiece lying in the object field of the camera and generate an image representing the portion; and an evaluation unit that evaluate the image by image processing for the purpose of ascertaining position data representing the actual position of at least one structural element of the workpiece in the object field, and comparing the actual position with a target position of the structural element and generating correction signals depending on a deviation of the actual position from the target position, the control unit configured to correct the processing position by controlling the workpiece movement system to match the actual position to the target position on the basis of the correction signals, and cause the laser processing unit to radiate in at least one laser beam directed at the workpiece to locally laser process the workpiece at at least one processing location of the workpiece.

12. The system according to claim 11, further comprising a mask movement system provided to carry the mask, said mask movement system, under control of the control unit, allowing a displacement of the mask in the mask plane and a rotation of the mask about an axis perpendicular to the mask plane.

13. The system according to claim 11, further comprising an illumination system that illuminates an illumination region on the workpiece with narrowband illumination light and/or by a wavelength-selective device arranged between the object plane of the camera and the camera, the wavelength-selective device transmitting only light from a narrow wavelength band to the camera, such that the light utilized for the image capture has a spectral bandwidth of 10 nm or less.

14. The system according to claim 11, wherein the laser processing unit comprises a beam deflection device with a substrate and, arranged thereon, a beam deflection surface oriented obliquely with respect to a principal axis of the laser processing unit and deflects the laser beam in a propagation direction running substantially parallel to the principal axis.

15. The system according to claim 11, wherein an observation beam path running between the processing plane of the laser processing unit and the camera leads through the beam deflection surface, the beam deflection device at least partly transmitting illumination light, the substrate of the beam deflection device being coated with a dielectric coating, designed such that it has a reflectance of more than 99% for entering laser light in the course of the angles of incidence present and has a transmission of at least 1% for the illumination light used for illumination, the transmission being 20% to 70%.

16. The system according to claim 14, further comprising an illumination light-transmitting astigmatism compensation unit arranged in the observation beam path between the beam deflection device and the camera, the substrate of the beam deflection device is an illumination light-transmitting plane plate tilted relative to the principal axis about a first tilt axis oriented perpendicular to the principal axis, and the astigmatism compensation unit comprises a plane plate transparent to illumination light and tilted relative to the principal axis about a second tilt axis oriented perpendicular to the first tilt axis.

17. The system according to claim 11, further comprising a camera-based beam analysis system integrated into the laser processing station for the in-situ analysis of beam parameters of the laser beam.

18. The system according to claim 17, wherein the beam analysis system comprises at least one beam analysis unit comprising a camera arrangement sensitive to the laser wavelength with a camera having an object field, the camera arrangement comprising a camera sensitive to the laser wavelength or a UV camera, or the camera arrangement comprises a camera sensitive to visible light and a planar converter arranged in an object plane of the camera and configured to convert light of the laser wavelength into light from the visible spectral range.

19. The system according to claim 17, wherein the beam analysis system comprises at least one of:

(i) a first beam analysis unit with a camera arrangement sensitive to the laser wavelength and comprising a camera having an object field that lies in the processing plane of the laser processing unit or in a plane optically conjugate to the processing plane and is arranged at the opposite side of the processing plane relative to the laser processing unit; and (ii) a second beam analysis unit with a camera arrangement sensitive to the laser wavelength and comprising a camera having an object field that lies in a plane optically conjugate to a mask plane, the camera being arranged in a continuation of an incidence direction of the laser beam, said incidence direction being oriented perpendicular to the principal axis of the laser processing unit.

20. The system according to claim 11, further comprising a camera-based shadowgraph analysis system integrated into the laser processing station for in-situ observation and analysis of rapidly proceeding processes in a region of the processing zone influenced by laser radiation, the shadowgraph analysis system comprising a short-pulse light source for the time-controlled incidence of short illumination light pulses in an incidence direction oriented transversely with respect to the laser beam and, at an opposite side, a camera for capturing shadowgraphs of the processing zone and provision being made of an evaluation unit for evaluating camera images of the camera.

21. The system according to claim 20, wherein the shadowgraph analysis system comprises a beam deflection system, a mirror system, with a deflection element or a deflection mirror, arranged between the short-pulse light source and the processing zone and deflects illumination light from a direction oriented obliquely with respect to the processing plane into an incidence direction running parallel to the processing plane and/or with a deflection element or deflection mirror, arranged between the processing zone and the camera and deflects radiation passing parallel or at an acute angle with respect to the processing plane into an incidence direction of the camera oriented obliquely with respect to the processing plane.

22. The system according to claim 20, wherein the shadowgraph analysis system is configured to generate, in a manner triggered by a laser pulse of the laser radiation source, an image with a multiplicity of illumination pulses triggered in temporally offset fashion such that the part detached from the workpiece is imaged in the image multiply, at different times at different positions, and for evaluating the image, trajectory tracking being carried out which involves ascertaining and analyzing the trajectory of a part detached from the workpiece by means of a laser pulse.

23. The method according to claim 5, wherein an astigmatism correction is introduced in the observation beam path between the beam deflection surface and the camera.

24. The method according to claim 6, wherein the illumination wavelength in the visible spectral range (VIS) comprises narrowband green light with a wavelength in the range of 490 nm to 575 nm being used for illumination.

* * * * *